(12) United States Patent
Taylor et al.

(10) Patent No.: US 6,977,954 B2
(45) Date of Patent: Dec. 20, 2005

(54) SEMICONDUCTOR LASER ARRAY DEVICE EMPLOYING MODULATION DOPED QUANTUM WELL STRUCTURES

(75) Inventors: Geoff W. Taylor, Storrs-Mansfield, CT (US); Scott W. Duncan, Andover, MA (US)

(73) Assignees: University of Connecticut, Farmington, CT (US); Opel, Inc., West Warwick, RI (US)

(*) Notice: Subject to any disclaimer, the term of this patent is extended or adjusted under 35 U.S.C. 154(b) by 124 days.

(21) Appl. No.: 10/627,043

(22) Filed: Jul. 25, 2003

(65) Prior Publication Data

US 2005/0018730 A1 Jan. 27, 2005

(51) Int. Cl.[7] .............................. H01S 3/19; H01S 3/10
(52) U.S. Cl. ......................................... 372/50; 372/45
(58) Field of Search .......................................... 372/50

(56) References Cited

U.S. PATENT DOCUMENTS

| | | | |
|---|---|---|---|
| 3,919,656 A | 11/1975 | Sokal et al. | 330/51 |
| 4,424,525 A | 1/1984 | Mimura | 357/23 |
| 4,658,403 A | 4/1987 | Takiguchi et al. | 372/96 |
| 4,683,484 A | 7/1987 | Derkits, Jr. | 357/16 |
| 4,806,997 A | 2/1989 | Simmons et al. | 357/16 |
| 4,814,774 A | 3/1989 | Herczfeld | 342/372 |
| 4,827,320 A | 5/1989 | Morkoc et al. | 357/22 |
| 4,829,272 A | 5/1989 | Kameya | 333/139 |
| 4,899,200 A | 2/1990 | Shur et al. | 357/30 |
| 4,949,350 A | 8/1990 | Jewell et al. | 372/45 |
| 5,010,374 A | 4/1991 | Cooke et al. | 357/16 |
| 5,105,248 A | 4/1992 | Burke et al. | 357/24 |
| 5,202,896 A | 4/1993 | Taylor | 372/50 |
| 5,293,393 A * | 3/1994 | Kosaka | 372/45 |
| 5,337,328 A | 8/1994 | Lang et al. | 372/45 |
| 5,349,599 A * | 9/1994 | Larkins | 372/50 |

(Continued)

OTHER PUBLICATIONS

*10-Gb/s High-Speed Monolithically Integrated Photoreceiver Using InGaAs p-I-n PD and Planar Doped InAlAs/InGaAs HEMT's* by Y. Akahori et al., IEEE Photonics Technology Letters, vol. 4, No. 7, Jul. 1992.

(Continued)

*Primary Examiner*—James Vannucci
(74) *Attorney, Agent, or Firm*—Gordon & Jacobson, P.C.

(57) ABSTRACT

An optoelectronic integrated circuit comprises a substrate, a multilayer structure formed on the substrate, and an array of thyristor devices and corresponding resonant cavities formed in the multilayer structure. The resonant cavities, which are adapted to process different wavelengths of light, are formed by selectively removing portions of said multilayer structure to provide said resonant cavities with different vertical dimensions that correspond to the different wavelengths. Preferably, that portion of the multilayer structure that is selectively removed to provide the multiple wavelengths includes a periodic substructure formed by repeating pairs of an undoped spacer layer and an undoped etch stop layer. The multilayer structure may be formed from group III-V materials. In this case, the undoped spacer layer and undoped etch stop layer of the periodic substructure preferably comprises undoped GaAs and undoped AlAs, respectively. The undoped AlAs functions as an etch stop during etching by a chlorine-based gas mixture that includes fluorine. The array of multi-wavelength thyristor devices may be used to realize devices that provide a variety of optoelectronic functions, such as an array of thyristor-based lasers that emit light at different wavelengths and/or an array of thyristor-based detectors that detect light at different wavelengths (e.g., for wavelength-division-multiplexing applications).

57 Claims, 12 Drawing Sheets

U.S. PATENT DOCUMENTS

| | | | |
|---|---|---|---|
| 5,386,128 A | | 1/1995 | Fossum et al. .......... 257/183.1 |
| 5,422,501 A | | 6/1995 | Bayraktaroglu ............. 257/195 |
| 5,436,759 A | | 7/1995 | Dijaili et al. ................ 359/333 |
| 5,625,636 A | * | 4/1997 | Bryan et al. ................... 372/50 |
| 5,698,900 A | | 12/1997 | Bozada et al. .............. 257/744 |
| 6,031,243 A | | 2/2000 | Taylor ......................... 257/13 |
| 6,043,519 A | | 3/2000 | Shealy et al. ................ 257/195 |
| 6,127,702 A | * | 10/2000 | Yamazaki et al. .......... 257/347 |
| 6,259,121 B1 | | 7/2001 | Lemoff et al. ................. 257/88 |
| 6,621,125 B1 | * | 9/2003 | Wang ......................... 257/355 |
| 6,734,453 B2 | * | 5/2004 | Atanackovic et al. ......... 257/19 |
| 2002/0067877 A1 | | 6/2002 | Braun et al. |

OTHER PUBLICATIONS

*10-Gbit/s InP-Based High-Performance Monolithic Photoreceivers Consisting of p-i-n Photodiodes and HEMT's* by Kiyoto Takahata et al., IEICE Trans. Electron., vol. E83-C, No. 6, Jun. 2000.

*10 Ghz Bandwidth Monolithic p-i-n Modulation-Doped Field Effect Transistor Photoreceiver* by N.K. Dutta et al., Appl. Phys. Lett., vol. 63, No. 15, Oct. 11, 1993.

*20 Gbit/s Long Wavelength Monolithic Integrated Photoreceiver Grown on GaAs* by V. Hurm et al., Electronic Letters, vol. 33, No. 7, Mar. 27, 1997.

*Heterojunction Field-Effect Transistor (HFET)* by G.W. Taylor et al., Electronics Letters, vol. 22, No. 15, pp. 784-786, Jul. 17, 1986.

*High Temperature Annealing of Modulation Doped GaAs/AlGaAs Heterostructures for FET Applications* by H. Lee et al., 1983 IEEE/Cornell Conf. On High-Speed Semiconductor Devices & Ckts, Aug. 1983.

*Monolithic Integrated Optoelectronic Circuits* by M. Berroth et al., 0-7803-2442-0-Aug. 1995 IEEE, 1995.

*Physical Layer Solution for Very Short Reach Applications Utilizing Parallel Optics* by Steve Ahart, Agilent Technologies, ONIDS 2002.

*Parallel Optics; the Solution for High-Speed Interconnects* downloaded from www.paralleloptics.org, Dec. 2000, updated Apr., May, Jul., Sep., Nov. 2001 and Jan., Apr. and Jul. 2002.

*Submicrometre Gate Length Scaling of Inversion Channel Heterojunction Field Effect Transistor* by P.A. Kiely et al., Electronics Letters, vol. 30, No. 6, Mar. 17, 1994.

*Theoretical and Experimental Results for the Inversion Channel Heterostructure Field Effect Transistor* by G.W. Taylor et al., IEEE Proceedings-G, vol. 140, No. 6, Dec. 1993.

*Vertical-Cavity Surface-Emitting Laser Diodes with Post-Growth Wavelength Adjustment* by Wipiejewski et al., IEEE Photonics Technology Letters, vol. 7, No. 7, Jul. 1995.

*Tunable VCSEL* by Chang-Hasnain, IEEE Journal on Selected Topics in Quantum Electronics, vol. 6, No. 6 Nov./Dec. 2000.

* cited by examiner

| LAYER MATERIAL | LAYER DOPING TYPE | TYPICAL DOPING CONCENTRATION (atoms/cm$^{+3}$) | TYPICAL LAYER THICKNESS(Å) | LAYER # |
|---|---|---|---|---|
| AlAs ⎫×7 | und | und | 40–100 | 183b |
| GaAs ⎭ | und | und | 8.75 | 183a |
| AlAs | und | und | 40–100 | 182 |
| InGaAs | P+ | 1E20 | 25 | 165b |
| GaAs | P+ | 1E20 | 75 | 165a |
| Al(0.7)Ga(0.3)As | P | 1E17 | 700 | 164b |
| Al(0.7)Ga(0.3)As | P+ | 1E19 | 10 | 164a |
| Al(.15)Ga(.85)As | P+ | 3.5E18 | 25 | 163d |
| Al(.15)Ga(.85)As | und | und | 200–300 | 163c |
| Al(.15)Ga(.85)As | N+ | 3.5E18 | 80 | 163b |
| Al(.15)Ga(.85)As | und | und | 20–30 | 163a |
| GaAs | und | und | 15 | 162 |
| In(.20)Ga(.80)AsN ⎫×3 | und | und | 60 | 161 |
| GaAs ⎭ | und | und | 100 | 160b |
| GaAs | und | und | 100–250 | 160a |
| Al(.15)Ga(.85)As | und | und | 5000 | 159 |
| GaAs ⎫×3 | und | und | 100 | 158 |
| In(.20)Ga(.80)AsN ⎭ | und | und | 60 | 157 |
| GaAs | und | und | 15 | 156 |
| Al(.15)Ga(.85)As | und | und | 30 | 155d |
| Al(.15)Ga(.85)As | P+ | 3.5E18 | 80 | 155c |
| Al(.15)Ga(.85)As | und | und | 300 | 155b |
| Al(.15)Ga(.85)As | N+ | 3.5E18 | 80 | 155a |
| Al(0.7)Ga(0.3)As | N | 1E17 | 700 | 154 |
| GaAs | N+ | 3.5E18 | 2200 | 153 |
| AlAs | und | und | 1701 | 151 |
| GaAs ⎫×7 | und | und | 696 | 152 |
| AlAs ⎭ | und | und | 1701 | 151 |
| GaAs SUBSTRATE | | SI | | 149 |

FIG.3

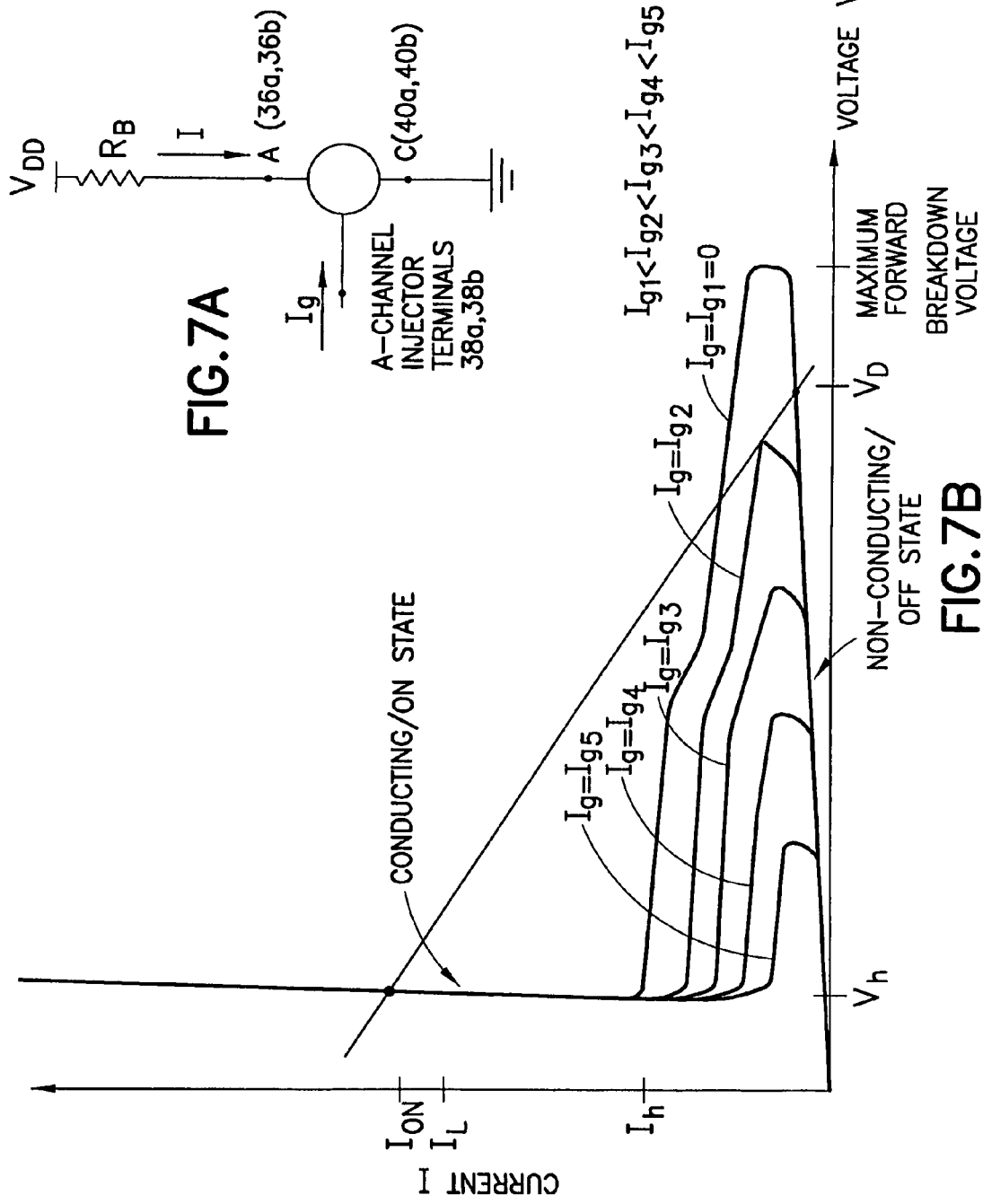

SEMICONDUCTOR LASER ARRAY DEVICE EMPLOYING MODULATION DOPED QUANTUM WELL STRUCTURES

BACKGROUND OF THE INVENTION

1. Field of the Invention

This invention relates broadly to field of semiconductor devices (and associated fabrication methodology) and, in particular, to semiconductor devices (and associated fabrication methodology) that utilize modulation doped quantum well heterojunctions to realize multiple-wavelength laser (detector) arrays.

2. State of the Art

Multi-wavelength laser arrays are attractive light sources for wavelength division multiplexing communication systems. Typically, such laser arrays are realized by vertical cavity surface-emitting lasers (VCSELs) fabricated into 2-D arrays. The emission wavelength of a VCSEL is usually determined during epitaxial growth by layer thicknesses.

In Wipiejewski et al., "Vertical-Cavity Surface-Emitting Laser Diodes with Post-Growth Wavelength Adjustment", a vertical-cavity laser is provided that includes an active layer sandwiched between a bottom Distributed Bragg Reflector (DBR) mirror and a top DBR mirror. The active layer consists of three InGaAs quantum wells with GaAs barriers and AlGaAs cladding layers. On top of the top DBR mirror is formed a GaAs tuning layer, an $SiO_2$ layer and reflective Au top layer. Etching of the GaAs tuning layer after epitaxial growth and before metal deposition sets the laser cavity length and corresponding emission wavelength of the vertical cavity laser. The emission wavelengths of individual lasers in a 2-D array VCSEL are controlled by adjusting the thickness of the GaAs tuning layer by a controllable etching process (utilizing anodic oxidation with in situ voltage monitoring and subsequent semiconductor oxide removal).

Although the vertical-cavity laser array of Wipiejewski et al. succeeds in providing in situ adjustment of the emission wavelength of the individual laser elements in a 2-D laser array, it has many disadvantages. For example, electrical contact is made through the GaAs tuning layer. Because the depth of the GaAs tuning layer varies from wavelength to wavelength, the threshold current of the devices of the array vary, which makes it very difficult to control the devices of the array. In addition, it is difficult to control the depth of the GaAs tuning layer when utilizing anodic etching as described, thus making it difficult to manufacture the array. Finally, in many applications (such as DWDM communication systems) there are significant cost advantages that arise by monolithic integration of a laser array with supporting electronic circuitry (e.g., laser drive circuitry), waveguides and/or other optoelectronic devices, and Wipiejewski et al. does not provide a mechanism for accomplishing such integration.

Wavelength division multiplexing communication systems also require multi-wavelength detection systems. Typically, such optical detection systems are realized by an optical demultiplexer (e.g., a fiber bragg grating or thin film optical filter) that separates the desired wavelength components in the incident light signal. The wavelength components are directed to a photodetector array. This approach is costly due to the high costs of packaging the optical demultiplexer with the photodetector array.

The state of the art in wavelength demultiplexing is performed by an element called the array wavelength grating (AWG). This is an element laid out in the plane of an integrated circuit that routes all wavelengths by waveguide into a free space region (parallel to the chip surface) from one side with a particular shape such that destructive interference takes place on the exit side and each wavelength is thereby guided to a unique output port. This arrangement is consumptive of real estate on the integrated circuit and is limited in wavelength resolution (i.e., the shape of the exit side will only allow a certain wavelength interval which is equivalent to the Q of an optically resonant filter).

Thus, there remains a need in the art for improved multi-wavelength laser/detection mechanisms in addition to multi-wavelength laser/detection mechanisms that are suitable for monolithic integration with a broad range of electronic circuitry (such as FETs and bipolar type transistors, logic, etc), waveguides and other optoelectronic devices.

SUMMARY OF THE INVENTION

It is therefore an object of the invention to provide multi-wavelength laser/detection mechanisms which may be integrated with a broad range of devices such as optical emitters, optical detectors, optical modulators, optical amplifiers, transistors, and optical waveguides.

It is another object of the invention to provide multi-wavelength light processing devices (multi-wavelength optical emitters, multi-wavelength optical detectors, multi-wavelength optical modulators, multi-wavelength optical amplifiers) that have improved ease of integration with a broad range of devices such as transistors, optical waveguides, and optical interconnects.

It is a further object of the invention to provide multi-wavelength light processing devices (multi-wavelength optical emitters, multi-wavelength optical detectors, multi-wavelength optical modulators, multi-wavelength optical amplifiers) utilizing an array of thyristor devices formed from a multilayer growth structure that can also be used to build a broad range of devices such transistors, optical waveguide devices and optical interconnects.

It is an additional object of the invention to provide a multilayer growth structure which can be used to realize on a single integrated circuit chip a multi-wavelength light processing device (multi-wavelength optical emitter, multi-wavelength optical detector, multi-wavelength optical modulator, multi-wavelength optical amplifier) and a wide range of optoelectronic devices (including FET devices, bipolar transistor devices, waveguide devices and optical interconnect devices).

Another object of the invention is to provide fabrication methodology that operates on a multilayer layer structure to produce an array of thyristor devices that can be adapted to operate as a multi-wavelength light processing device (multi-wavelength optical emitter, multi-wavelength optical detector, multi-wavelength optical modulator, multi-wavelength optical amplifier).

In accord with these objects, which will be discussed in detail below, an optoelectronic integrated circuit (and corresponding fabrication methodology) includes a substrate, a multilayer structure formed on the substrate, and an array of thyristor devices and corresponding resonant cavities formed in the multilayer structure. The resonant cavities, which are adapted to process different wavelengths of light, are formed by selectively removing portions of said multilayer structure to provide the resonant cavities with different vertical dimensions that correspond to the different wavelengths. Preferably, that portion of the multilayer structure that is selectively removed to provide the multiple wavelengths includes a periodic substructure formed by repeating pairs of an undoped spacer layer and an undoped etch stop layer. The multilayer structure may be formed from group III-V materials. In this case, the undoped spacer layer and undoped etch stop layer of the periodic substructure preferably comprises undoped GaAs and undoped AlAs, respectively. The undoped AlAs functions as an etch stop during etching by a chlorine-based gas mixture that includes fluorine.

It will be appreciated that the array of multi-wavelength thyristor devices can be used to realize devices that provide a variety of optoelectronic functions, such as an array of thyristor-based lasers that emit light at different wavelengths and/or an array of thyristor-based detectors that detect light at different wavelengths (e.g., for wavelength-division-multiplexing applications). In addition, the array of multi-wavelength thyristor devices is well suited for monolithic integration with a wide range of optoelectronic devices (including FET devices, bipolar transistor devices, waveguide devices and optical interconnect devices).

Additional objects and advantages of the invention will become apparent to those skilled in the art upon reference to the detailed description taken in conjunction with the provided figures.

BRIEF DESCRIPTION OF THE DRAWINGS

FIG. 3 is a schematic showing an exemplary multilayer structure made with group III-V material in accordance with the present invention, and from which the multiple wavelength thyristor array and other optoelectronic/electronic devices can be made in accordance with the present invention.

FIG. 7A is a pictorial illustration of an exemplary configuration of a thyristor as a laser.

FIG. 7B is a graph showing the current-voltage characteristics of the thyristor device in the NON-Conducting/OFF state of operation and the Conducting/ON state of operation, and the operational conditions that cause the thyristor device to switch between the OFF state of operation and the ON state of operation.

DETAILED DESCRIPTION OF THE PREFERRED EMBODIMENTS

The present invention builds upon novel device structures utilizing modulation-doped quantum well (QW) heterojunctions that do not suffer from the problems associated with the prior art PHEMT devices and prior art HBT devices. Such novel device structures are described in detail in U.S. Pat. No. 6,031,243; U.S. patent application Ser. No. 09/556,285, filed on Apr. 24, 2000; U.S. patent application Ser. No. 09/798,316 filed on Mar. 2, 2001; International Application No. PCT/US02/06802 filed on Mar. 4, 2002; U.S. patent application Ser. No. 08/949,504, filed on Oct. 14, 1997, U.S. Pat. application Ser. No. 10/200,967, filed on Jul. 23, 2002; U.S. application Ser. No. 09/710,217, filed on Nov. 10, 2000; U.S. patent application Ser. No. 60/376,238, filed on Apr. 26, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; each of these references herein incorporated by reference in its entirety.

Figure 1:
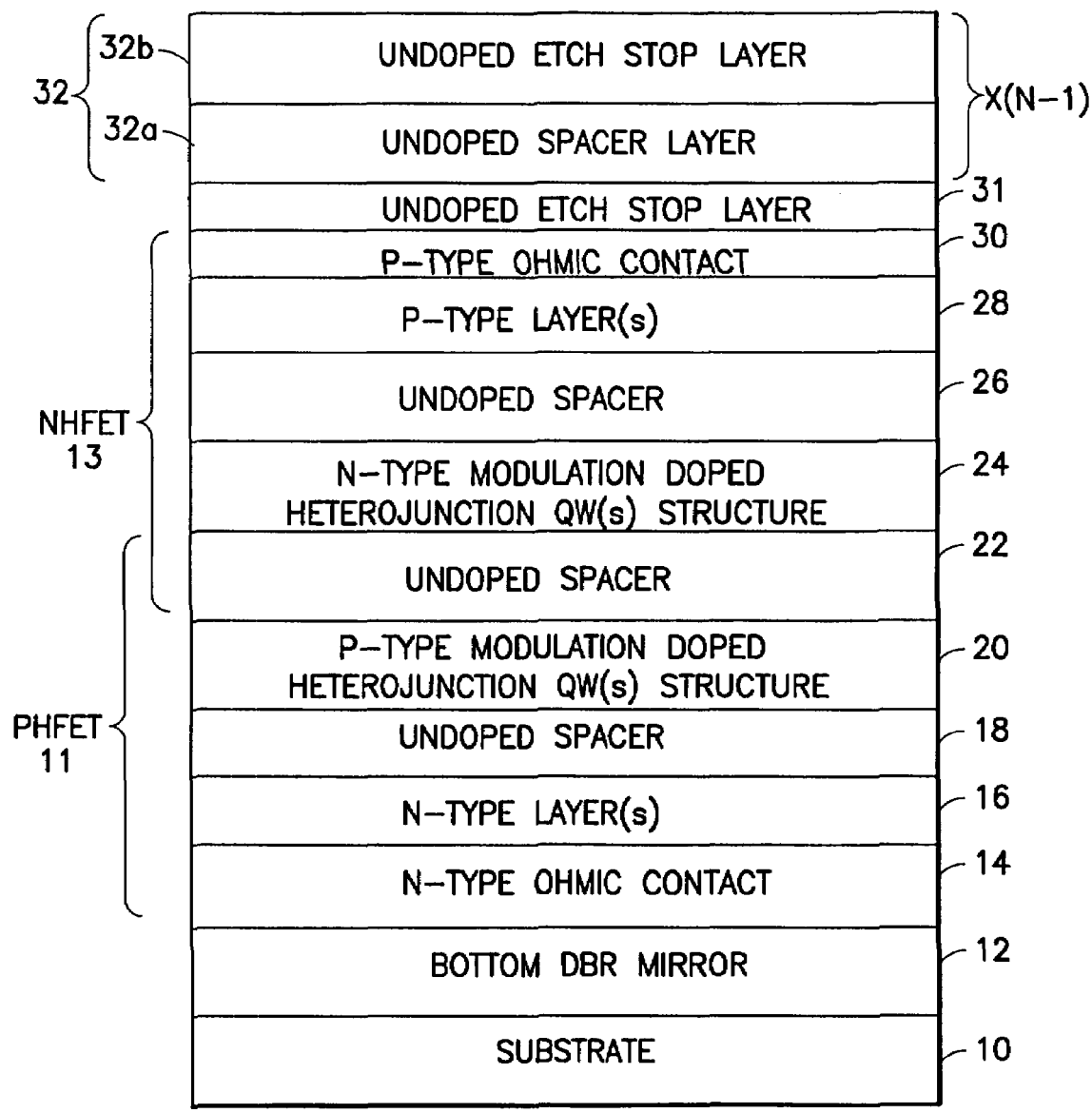
FIG. 1 is a schematic showing a multilayer structure in accordance with the present invention, and from which the multi-wavelength thyristor array and other optoelectronic/electronic devices can be made in accordance with the present invention.

Turning now to FIG. 1, a multi-layer sandwich structure in accordance with the present invention, and from which devices of the present invention can be made, includes a bottom dielectric distributed bragg reflector (DBR) mirror 12 formed on a substrate 10. The bottom DBR mirror 12 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$. Deposited upon the bottom DBR mirror 12 is the active device structure which logically consists of two HFET devices. The first of these is a p-channel HFET device 11 (referred to herein as PHFET 11) comprising layers 14, 16, 18, 20 and 22. The PHFET device 11 which has one or more p-type modulation doped QW channels and is positioned with the gate terminal on the lower side (i.e. on the bottom DBR mirror 12) and the collector terminal on the upper side. The second of these is an n-channel HFET device 13 (referred to herein as NHFET 13) comprising layers 22, 24, 26, 28, 30. The NHFET device 13 has one or more n-type modulation doped QW channels and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type ohmic contact layer(s) 14 which enables the formation of ohmic contacts thereto. Deposited on layer 14 are one or more n-type layer(s) 16. Preferably, the doping of layer(s) 16 is such that it should not be depleted in any range of operation of the device, i.e. the total doping in this layer should exceed the total doping charge contained in the modulation doped layer of the p-type modulation doped QW structure 20 described below. This layer 16 also serves optically as a small part of the lower waveguide cladding for optical devices realized in this structure. Note that a majority of the lower waveguide cladding is provided by the lower DBR mirror 12 itself. Deposited on layer 16 is an undoped spacer layer 18. Layers 14, 16 and 18 serve electrically as part of the gate of the p-channel HFET 11. In this configuration, layer 14 achieves low contact resistance and layer 18 defines the capacitance of the p-channel HFET 11 with respect to the p-type modulation doped QW heterostructure 20. Deposited on layer 18 is a p-type modulation doped QW structure 20 that defines one or more quantum wells (which may be formed from strained or unstrained heterojunction materials). Deposited on the p-type modulation doped QW structure 20 is an undoped spacer layer 22, which forms the collector of the P-channel HFET device 11. All of the layers grown thus far form the P-channel HFET device 11 with the gate ohmic contact on the bottom.

Undoped spacer layer 22 also forms the collector region of the N-channel HFET device 13. Deposited on layer 22 is an n-type modulation doped QW structure 24 that defines one or more quantum wells (which may be formed from strained or unstrained heterojunction materials). Deposited on the n-type modulation doped QW structure 24 is an undoped spacer layer 26. Deposited on layer 26 are one or more p-type layer(s) 28. Preferably, the doping of layer(s) 28 is such that it should not be depleted in any range of operation of the device, i.e. the total doping in this layer should exceed the total doping charge contained in the modulation doped layer of the n-type modulation doped QW structure 24 described above. Deposited on layer 28 are one or more p-type ohmic contact layer(s) 30 which enable the formation of ohmic contacts thereto. In this configuration, layer 30 achieves low contact resistance and layer 26 defines the capacitance of the n-channel HFET 13 with respect to the n-type modulation doped QW heterostructure 24. Layers 28 and 30 serve electrically as part of the gate of the n-channel HFET 13.

Alternatively, the active device structure may be described as a pair of stacked quantum-well-base bipolar transistors formed on the bottom DBR mirror 12. The first of these is an n-type quantum-well-base bipolar transistor (comprising layers 14, 16, 18, 20 and 22) which has one or more p-type modulation doped quantum wells and is positioned with the emitter terminal on the lower side (i.e. on the mirror as just described) and the collector terminal on the upper side. The second of these is an n-type quantum-well-base bipolar transistor comprising layers 22, 24, 26, 28, and 30. This n-type quantum-well-base bipolar transistor has one or more n-type modulation doped quantum wells and is positioned with the emitter terminal on the top side and the collector terminal on the lower side (which is the collector of the p-type quantum-well-base bipolar transistor). Therefore a non-inverted n-channel device is stacked upon an inverted p-channel device to form the active device structure. In this configuration, the gate terminal of the p-channel HFET device 11 corresponds to the emitter terminal of the p-type quantum-well-base bipolar transistor, the p-type QW structure 20 corresponds to the base region of the p-type quantum-well-base bipolar transistor, spacer layer 22 corresponds to the collector region of both the p-type quantum-well-base bipolar transistor and the n-type quantum-well-base bipolar transistor, the n-type QW structure 24 corresponds to the base region of the n-type quantum-well-base bipolar transistor, and the gate terminal of the n-channel HFET device 13 corresponds to the emitter electrode of the n-type quantum-well-base bipolar transistor.

Deposited on the active device layer structure is a thin undoped etch stop layer 31 and number N of undoped multilayer structures arranged one on top of the other to form a periodic structure. Each multilayer structure 32 (which forms a period of the periodic structure) includes an undoped spacer layer 32a and a thin undoped etch stop layer 32b. As described below in detail, the N multilayer structures are selectively etched away to set the optical path length (and corresponding wavelength) of the resonant cavity thyristor devices formed therein. The thickness of the spacer layer 30a in each undoped multilayer structure 30 determines the range of optical path lengths (and corresponding range of wavelengths) for the resonant cavity thyristor devices.

Note that etch stop layer 31 and etch stop layer 32b of the periodic structure are optional, but may be helpful. More specifically, these layers serve as an etch stop when selectively etching away portions of the N multilayer structures to thereby enable the undoped spacer layers to be removed sequentially with greater accuracy and efficiency.

To form a resonant cavity device where light enters into and/or is emitted from the device laterally (i.e., from a direction normal to the cross section of FIG. 1), a diffraction grating and top dielectric mirror are formed over that portion of the periodic multilayer structure which remains after selective etching of the periodic multilayer structure. For resonant cavity lasing devices, the diffraction grating performs the function of diffracting light produced by the resonant cavity into light propagating laterally in a waveguide which has the top dielectric mirror and bottom DBR mirror as waveguide cladding layers. For resonant cavity detecting devices, the diffraction grating performs the function of diffracting incident light that is propagating in the lateral direction into a vertical mode, where it is absorbed resonantly in the resonant cavity.

Alternatively, light may enter (and/or exit) the resonant cavity in a vertical direction through an optical aperture (not shown) in the top surface (or bottom surface) of the device. In this case, the diffraction grating is omitted, and the top dielectric mirror and bottom DBR mirror define a resonant cavity for the vertical emission (and/or absorption) of light such that the device operates as a vertical cavity surface emitting laser (detector).

The optical path length between the bottom DBR mirror and top dielectric mirror preferably represents an integral number of ½ wavelengths at the designated wavelength. This optical path length is controlled by selectively etching away portions of the periodic multilayer structure prior to formation of the top dielectric mirror to thereby enable this condition.

Figure 2A:
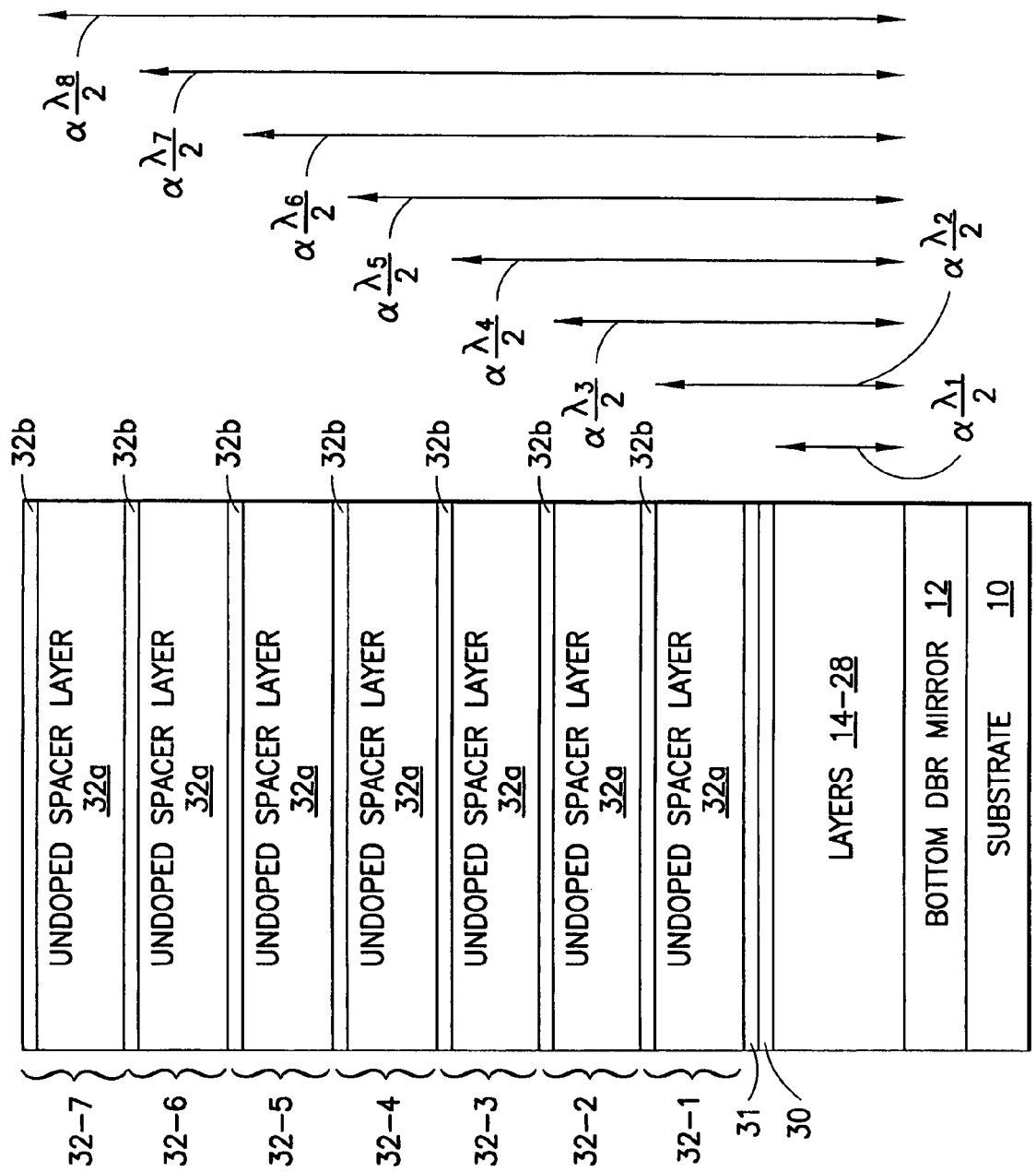
FIG. 2A is a schematic showing an exemplary multilayer structure having a seven period spacer layer structure formed over the modulation-doped quantum well active device structure of FIG. 1 in accordance with the present invention, and from which the multi-wavelength thyristor array and other optoelectronic/electronic devices can be made in accordance with the present invention.

Turning now to FIG. 2A, there is shown an exemplary epitaxial growth structure having a seven undoped multilayer structures (32-1, 32-2 . . . 32-7) formed above the active device structure (layers 14 through 30). The optical path length between the bottom DBR mirror 12 and the etch stop layer 31 represents an integral number of ½ wavelengths at a first wavelength $\lambda_1$. The optical path length between the bottom DBR mirror 12 and the etch stop layer 32b for the multilayer structure 32-1 represents an integral number of ½ wavelengths at a second wavelength $\lambda_2$. The optical path length between the bottom DBR mirror 12 and the etch stop layer 32b for the multilayer structure 32-2 represents an integral number of ½ wavelengths at a third wavelength $\lambda_3$. The optical path length between the bottom DBR mirror 12 and the etch stop layer 32b for the multilayer structure 32-3 represents an integral number of ½ wavelengths at a fourth wavelength $\lambda_4$. The optical path length between the bottom DBR mirror 12 and the etch stop layer 32b for the multilayer structure 32-4 represents an integral number of ½ wavelengths at a fifth wavelength $\lambda_5$. The optical path length between the bottom DBR mirror 12 and the etch stop layer 32b for the multilayer structure 32-5 represents an integral number of ½ wavelengths at a sixth wavelength $\lambda_6$. The optical path length between the bottom DBR mirror 12 and the etch stop layer 32b for the multilayer structure 32-6 represents an integral number of ½ wavelengths at a seventh wavelength $\lambda_7$. The optical path length between the bottom DBR mirror 12 and the etch stop layer 32b for the multilayer structure 32-7 represents an integral number of ½ wavelengths at an eighth wavelength $\lambda_8$.

In this configuration, the optical path length (and corresponding wavelength) of the resonant cavities formed from this epitaxial growth structure is controlled by selectively etching away portions of the multilayer structures 32-1 . . . 32-7 prior to formation of the top dielectric mirror. More specifically, an optical path length corresponding to the first wavelength $\lambda_1$ is obtained by etching away the seven multilayer structures 32-7 through 32-1 (and removing the etch stop layer 31) over the active device structure for the cavity; an optical path length corresponding to the second wavelength $\lambda_2$, is obtained by etching away the six multilayer structures 32-7 through 32-2 (and removing the etch stop layer 32b for the multilayer structure 32-1) over the active device structure for the cavity; an optical path length corresponding to the third wavelength $\lambda_3$ is obtained by etching away the five multilayer structures 32-7 through 32-3 (and removing the etch stop layer 32b for the multilayer structure 32-2) over the active device structure for the cavity; an optical path length corresponding to the fourth wavelength $\lambda_4$ is obtained by etching away the four multilayer structures 32-7 through 32-4 (and removing the etch stop layer 32b for the multilayer structure 32-3) over the active device structure for the cavity; an optical path length corresponding to the fifth wavelength $\lambda_5$ is obtained by etching away the three multilayer structures 32-7 through 32-5 (and removing the etch stop layer 32b for the multilayer structure 32-4) over the active device structure for the cavity; an optical path length corresponding to the sixth wavelength $\lambda_6$ is obtained by etching away the two multilayer structures 32-7 and 32-6 (and removing the etch stop layer 32b for the multilayer structure 32-5) over the active device structure for the cavity; an optical path length corresponding to the seventh wavelength $\lambda_7$ is obtained by etching away the multilayer structure 32-7 (and removing the etch stop layer 32b for the multilayer structure 32-6) over the active device structure for the cavity; and, an optical path length corresponding to the eighth wavelength $\lambda_8$ is obtained by removing the etch stop layer 32b for the multilayer structure 32-7 over the active device structure for the cavity. After this etching process, the top dielectric mirror (and possibly a diffraction grating) are formed above the resulting structure to form a plurality of resonant cavities whose optical path lengths correspond to the desired wavelengths.

Figure 2B:
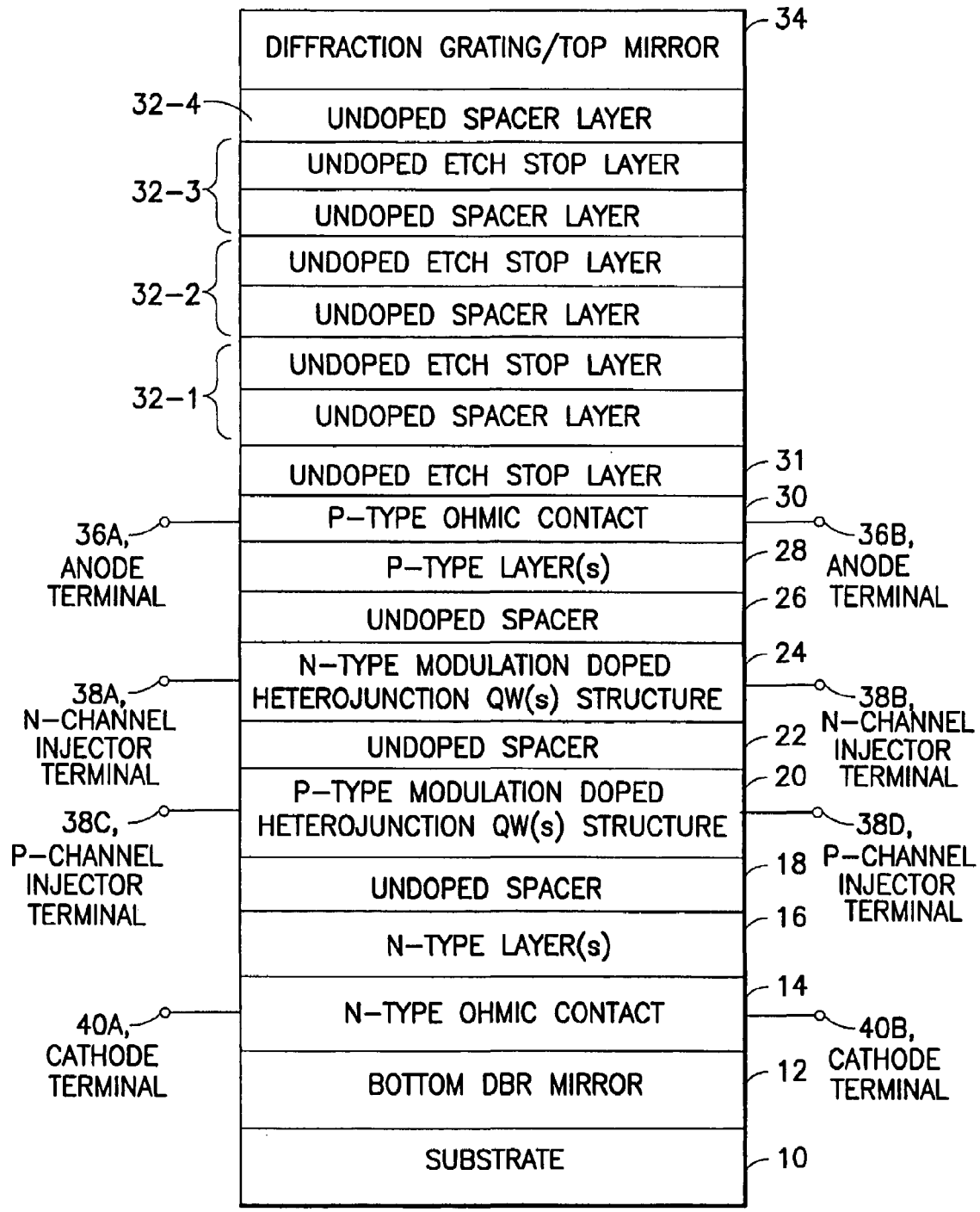
FIG. 2B is a schematic showing an exemplary thyristor device of a multi-wavelength thyristor array formed from the layer structure of FIG. 2A wherein three periods of the original seven period spacer layer structure are removed via in situ etching operations.
Figure 2C:
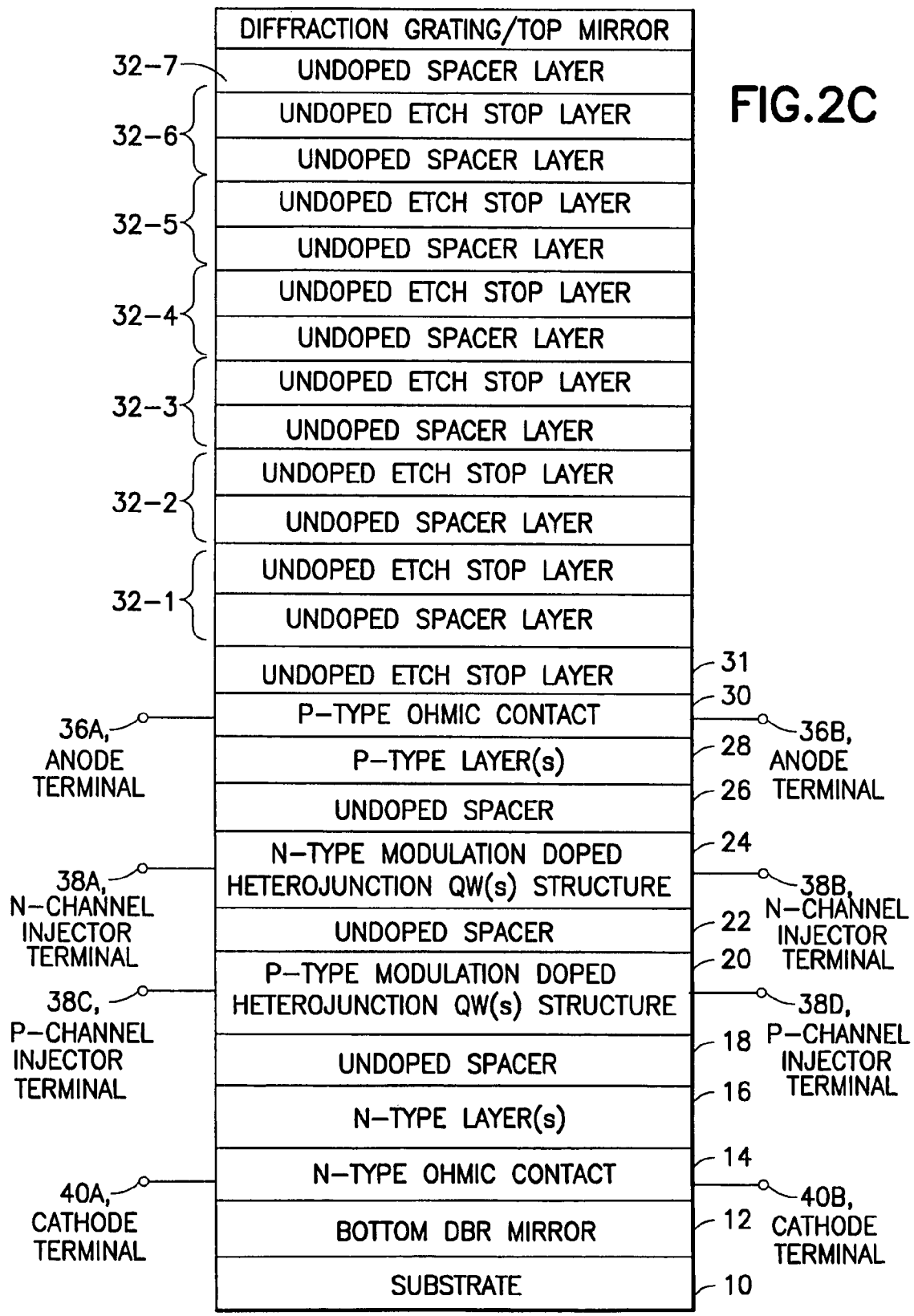
FIG. 2C is a schematic showing another exemplary thyristor device of a multi-wavelength thyristor array formed from the layer structure of FIG. 2A wherein the original seven period spacer layer structure is retained during in situ etching operations.

For example, FIG. 2B illustrates a thyristor device formed in conjunction with a resonant cavity whose optical path length corresponds to the fifth wavelength $\lambda_5$; while FIG. 2C illustrates a thyristor device formed in conjunction with a resonant cavity whose optical path length corresponds to the eighth wavelength $\lambda_8$. In both devices, one or more anode terminal electrodes (two shown as 36a and 36b) are operably coupled to the top p-type ohmic contact layer, one or more n-channel injector terminal electrodes (two shown as 38a, 38b) are operably coupled to the n-type QW structure 24, one or more p-channel injector terminal electrodes (two shown as 38C, 38D) are operably coupled to the p-type QW structure 20, and one or more cathode terminal electrodes (two shown as 40a, 40b) are operably coupled to the n-type ohmic contact layer 14. In alternative embodiments, the p-channel injector terminals (38c, 38d) may be omitted. In such a configuration, the N-channel injector terminals (38a, 38b), which are coupled to the n-type inversion QW structure 24 are used to control charge in such n-type inversion QW channel(s) as described herein. In yet another alternative embodiment, the N-channel injector terminals (38a, 38b) may be omitted. In such a configuration, the p-channel injector terminals (38c, 38d), which are coupled to the p-type inversion QW structure 20 are used to control charge in such p-type inversion QW channel(s) as described herein.

The epitaxial growth structures described above may be realized with a material system based on group III-V materials (such as a GaAs/AlGaAs). Alternatively, strained silicon heterostructures employing silicon-germanium (SiGe) layers may be used to realize the multilayer structures described herein. FIG. 3 illustrates an exemplary epitaxial growth structure utilizing group III-V materials for realizing the structure of FIG. 1 and the optoelectrical/electrical/optical devices formed from this structure in accordance with the present invention.

The structure of FIG. 3 can be made, for example, using known molecular beam epitaxy (MBE) techniques. As shown, a first semiconductor layer 151 of AlAs and a second semiconductor layer 152 of GaAs are alternately deposited (with preferably at least seven pairs) upon a semi-insulating gallium arsenide substrate 149 in sequence to form the bottom distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. This center wavelength is selected such that all of the resonant wavelengths for the various cavities of the array will be subject to high reflectivity. Therefore the thicknesses of layers 151 and 152 in the mirror are chosen so that the final optical thickness of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the p-channel HFET (PHFET) 11 (see FIG. 1), which has one or more p-type modulation doped quantum wells and is positioned with the gate terminal on the bottom (i.e. on the mirror 12 just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active-device layer structure begins with layer 153 of N+ type GaAs that enables the formation of ohmic contacts thereto (for example, when contacting to the cathode terminal of a thyristor device, the gate terminal of an inverted p-channel HFET device, the sub-collector terminal of an n-channel HFET device, or the emitter terminal of a p-type quantum-well-base bipolar device). Layer 153 has a typical thickness of 1000–3000 Å and a typical n-type doping of $3.5 \times 10^{18}$ cm$^{-3}$. The N+ doped GaAs layer 153 corresponds to the ohmic contact layer 14 of FIG. 1. Deposited on layer 153 is layer 154 of n-type $Al_{x1}Ga_{1-x1}As$ with a typical thickness of 500–3000 Å and a typical doping of $1 \times 10^{17}$ cm$^{-3}$. The parameter x1 is preferably in the range between 70% and 80% (for example, on the order of 70%) for layer 154. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are 4 layers (155a, 155b, 155c, and 155d) of $Al_{x2}Ga_{1-x2}As$. These 4 layers (collectively, 155) have a total thickness about 380–500 Å and where x2 is about 15%. The first layer 155a is about 60-80 Å thick and is doped N+ type in the form of delta doping. The second layer 155b is about 200–300 Å thick and is undoped. The third layer 155c is about 80 Å thick and is doped P+ type in the form of delta doping. The fourth layer 155d is about 20–30 Å thick and is undoped to form a spacer layer. This layer forms the lower separate confinement heterostructure (SCH) layer for the laser, amplifier and modulator devices. The n-type AlGaAs layer 154 and n-type AlGaAs layer 155a correspond to the n-type layer(s) 16 of FIG. 1, and the undoped AlGaAs layer 155b corresponds to the undoped spacer layer 18 of FIG. 1.

The next layers define the quantum well(s) that form the inversion channel(s) during operation of the PHFET 11. For a strained quantum well, this includes a spacer layer 156 of undoped GaAs that is about 10–25 Å thick and then combinations of a quantum well layer 157 that is about 40–80 Å thick and a barrier layer 158 of undoped GaAs. The quantum well layer 157 may be comprised of a range of compositions. In the preferred embodiment, the quantum well is formed from an $In_{0.2}Ga_{0.8}AsN$ composition with the nitrogen content varying from 0% to 5% depending upon the desired natural emission frequency. Thus, for a natural emission frequency of 0.98 µm, the nitrogen content will be 0%; for a natural emission frequency of 1.3 µm, the nitrogen content will be approximately 2%; and for a natural emission frequency of 1.5 µm, the nitrogen content will be approximately 4–5%. The well barrier combination will typically be repeated (for example, three times as shown), however single quantum well structures may also be used. Unstrained quantum wells are also possible. Following the last barrier of undoped GaAs is a layer 159 of undoped $Al_{x2}Ga_{1-x2}As$ which forms the collector of the PHFET device 11 and is about 0.5 µm in thickness. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 1. Undoped AlGaAs layer 159 corresponds to the undoped spacer layer 22 of FIG. 1.

Layer 159 also forms the collector region of the NHFET device 13. Deposited on layer 159 are two layers (collectively 160) of undoped GaAs of about 200–250 Å total thickness, which form the barrier of the first n-type quantum well. Layer 160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 160 includes a single layer 160a of about 150 Å and a barrier layer 160b of about 100 Å. The next layer 161 is the quantum well of $In_{0.2}Ga_{0.8}As$, which is undoped and about 40–80 Å in thickness. It is noted that the n-type quantum well layer 161 need not be of the same formulation as the p-type quantum well layer 157. The barrier layer 160b of 100 Å and quantum well layer 161 may be repeated, e.g., three times. Then there is a barrier layer 162 of about 10–30 Å of undoped GaAs which accommodates a growth interruption and a change of growth temperature. Next there are four layers (collectively 163) of $Al_{x2}Ga_{1-x2}As$ of about 300–500 Å total thickness. These four layers (163) include a spacer layer 163a of undoped $Al_{x2}Ga_{1-x2}As$ that is about 20-30 Å thick, a modulation doped layer 163b of N+ type doping of $Al_{x2}Ga_{1-x2}As$ (with doping about $3.5 \times 10^{18}$ cm$^{-3}$) that is about 80 Å thick, a spacer layer 163c of undoped $Al_{x2}Ga_{1-x2}As$ that is about 200–300 Å thick, and a P+ type delta doped layer 163d of $Al_{x2}Ga_{1-x2}As$ (with doping about $3.5 \times 10^{18}$ cm$^{-3}$) that is about 60–80 Å in thickness. Layers 163b and 163d form the top plate and bottom plate of a parallel plate capacitor which forms the field-effect input to all active devices. The doping species for layer 163d is preferably carbon (C) to ensure diffusive stability. In contrast to layer 163b which is always depleted, layer 163d should never be totally depleted in operation. For the optoelectronic device operation, layer 163 is the upper SCH region. The layers between the undoped GaAs barrier layer 160a and the N+ AlGaAs layer 163b correspond to the n-type modulation doped heterojunction QW structure 24 of FIG. 1. Undoped AlGaAs layer 163c corresponds to the undoped spacer layer 26 of FIG. 1.

One or more layers (collectively 164) of p-type $Al_{x1}Ga_{1-x1}As$ are deposited next to form part of the upper waveguide cladding for the laser, amplifier and modulator devices. Note that a majority of the upper waveguide cladding for waves propagating in the guide formed by the optically active region of the device is provided by the upper dielectric mirror itself. The upper dielectric mirror causes the light to be guided partially as a dielectric waveguide and partially as a mirror waveguide. Preferably, layer 164 has a thickness on the order of 500–1500 Å, and includes a first thin sublayer 164a that is 10–20 Å thick and has a P+ doping of $10^{19}$ cm$^{-3}$ and a second sublayer 164b that is 700 Å thick and has a P doping of $1 \times 10^{17}$ –$5 \times 10^{17}$ cm$^{-3}$. The parameter x1 of layer 164 is preferably about 70%. The p-type layers 163b, 164a, 164b correspond to the p-type layer(s) 28 of FIG. 1.

Deposited next is an ohmic contact layer 165 (which may comprise a single layer of GaAs or a combination of GaAs (165a) and InGaAs (165b) as shown). Layer 165 is about 50–100 Å thick and is doped to a very high level of P+ type doping (about $1 \times 10^{20}$ cm$^{-3}$) to enable formation of ohmic contacts thereto (for example, when contacting to the anode terminal of a thyristor device).

Alternatively, the active device structure may be described as a pair of stacked quantum-well-base bipolar transistors formed on the bottom DBR mirror (layers 151/152). The first of these is an p-type quantum-well-base bipolar transistor (comprising layers 153 through 159) which has one or more p-type modulation doped quantum wells and is positioned with the emitter terminal on the lower side (i.e. on the bottom mirror as just described) and the collector terminal on the upper side. The second of these is an n-type quantum-well-base bipolar transistor (comprising layers 159 through 165*b*) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminals 40*a*, 40*b* of the thyristor device corresponds to the emitter electrode of the p-type quantum-well-base bipolar transistor, the p-type QW structure (layers 155*c* though 158) corresponds to the base region of the p-type quantum-well-base bipolar transistor, spacer layer 159 corresponds to the collector region of both the p-type quantum-well-base bipolar transistor and the n-type quantum-well-base bipolar transistor, the n-type QW structure (layers 160*a* through 163*b*) corresponds to the base region of the n-type quantum-well-base bipolar transistor, and the anode terminals 36*a*, 36*b* of the thyristor device correspond to the emitter electrode of the n-type quantum-well-base bipolar transistor.

Deposited on the active device layer structure is an undoped AlAs layer 182 which is on the order of 40–100 Å thick and a periodic layer structure formed from an undoped GaAs layer 183*a* and an undoped AlAs layer 183*b*. The GaAs layer 183*a* and AlAs layer 183*b* are deposited as pairs for a number of growth iterations (for example, 7 times as shown). Because these additional layers are formed in conjunction with the active device layer structure, they are lattice matched to the underlying growth structure. The thicknesses of the GaAs layers 183*a* of the periodic layer structure define the shift in the wavelengths of the resonant cavity devices formed by the selective etching of the periodic structure as described herein. Preferably, the GaAs layers 183*a* of the periodic layer structure have uniform thicknesses to provide a uniform shift over the wavelengths formed by the selective etching of the periodic structure as described herein.

It will be appreciated that AlAs layer 182 and the AlAs layers 183*b* of the periodic structure are optional, but may be helpful. More specifically, these layers serve as an etch stop when selectively etching away portions of the periodic structures to thereby enable the undoped GaAs spacer layers to be removed sequentially with greater accuracy and efficiency. When the AlAs layers 183*b* are omitted, it is possible to form the GaAs spacer structure in a single growth iteration. In this case, the GaAs spacer structure is selectively etched away to the depths that correspond to the vertical cavity dimensions/wavelengths for the array of eight thyristor devices. This process requires accurate control of the etching process, but the resulting structure is simpler and resonant cavities with smaller wavelength increments can be formed.

For example, suppose that the shortest wavelength of the eight resonant cavities, $\lambda_0$, is on the order of 1550 nm, and the minimum frequency interval between adjacent channels, $\Delta v$, is on the order of 50 GHz. In this case, the minimum wavelength interval, $\Delta\lambda$, is equal to $\Delta v \lambda^2/c = 2.5$ Å. This corresponds to a depth in the GaAs material of 2.5 Å$*n_{GaAs}$, which is on the order of 8.75 Å. The cavities are resonant at 3½ wavelengths. Therefore, the thickness variation between resonant cavities will be 3.5*8.75 Å, which is about 30.6 Å. For this thickness value, it is preferable not to use the AlAs layers 183*b* of the periodic structure (and possibly the AlAs layer 182). Rather, the GaAs spacer structure is etched in increments on the order of 30 Å in accordance with the eight wavelengths of the resonant cavities, $\lambda_0$, $(\lambda_0+\Delta\lambda)$, $(\lambda_0+2\Delta\lambda)$, $(\lambda_0+3\Delta\lambda)$, $(\lambda_0+4\Delta\lambda)$, $(\lambda_0+5\Delta\lambda)$, $(\lambda_0+6\Delta\lambda)$, and $(\lambda_0+7\Delta\lambda)$.

To form a resonant cavity device where light enters into and/or is emitted from the device laterally (i.e., from a direction normal to the cross-section of FIG. 3), a diffraction grating (for example, as described in detail in U.S. Pat. No. 6,031,243) and top dielectric mirror are formed over that portion of the periodic multilayer structure which remains after selective etching of the periodic multilayer structure. For resonant cavity lasing devices, the diffraction grating performs the function of diffracting light produced by the resonant cavity into light propagating laterally in a waveguide which has the top dielectric mirror and bottom DBR mirror as waveguide cladding layers. For resonant cavity detecting devices, the diffraction grating performs the function of diffracting incident light that is propagating in the lateral direction into a vertical mode, where it is absorbed resonantly in the resonant cavity.

Alternatively, light may enter (and/or exit) the resonant cavity in a vertical direction through an optical aperture (not shown) in the top surface (or bottom surface) of the device. In this case, the diffraction grating is omitted, and the top dielectric mirror and bottom DBR mirror define a resonant cavity for the vertical emission (and/or absorption) of light such that the device operates as a vertical cavity surface emitting laser (detector).

The optical path length between the bottom DBR mirror and top dielectric mirror preferably represents an integral number of ½ wavelengths at the designated wavelength. This optical path length is controlled by selectively etching away portions of the periodic multilayer structure prior to formation of the top dielectric mirror to thereby enable this condition.

Figure 4A:
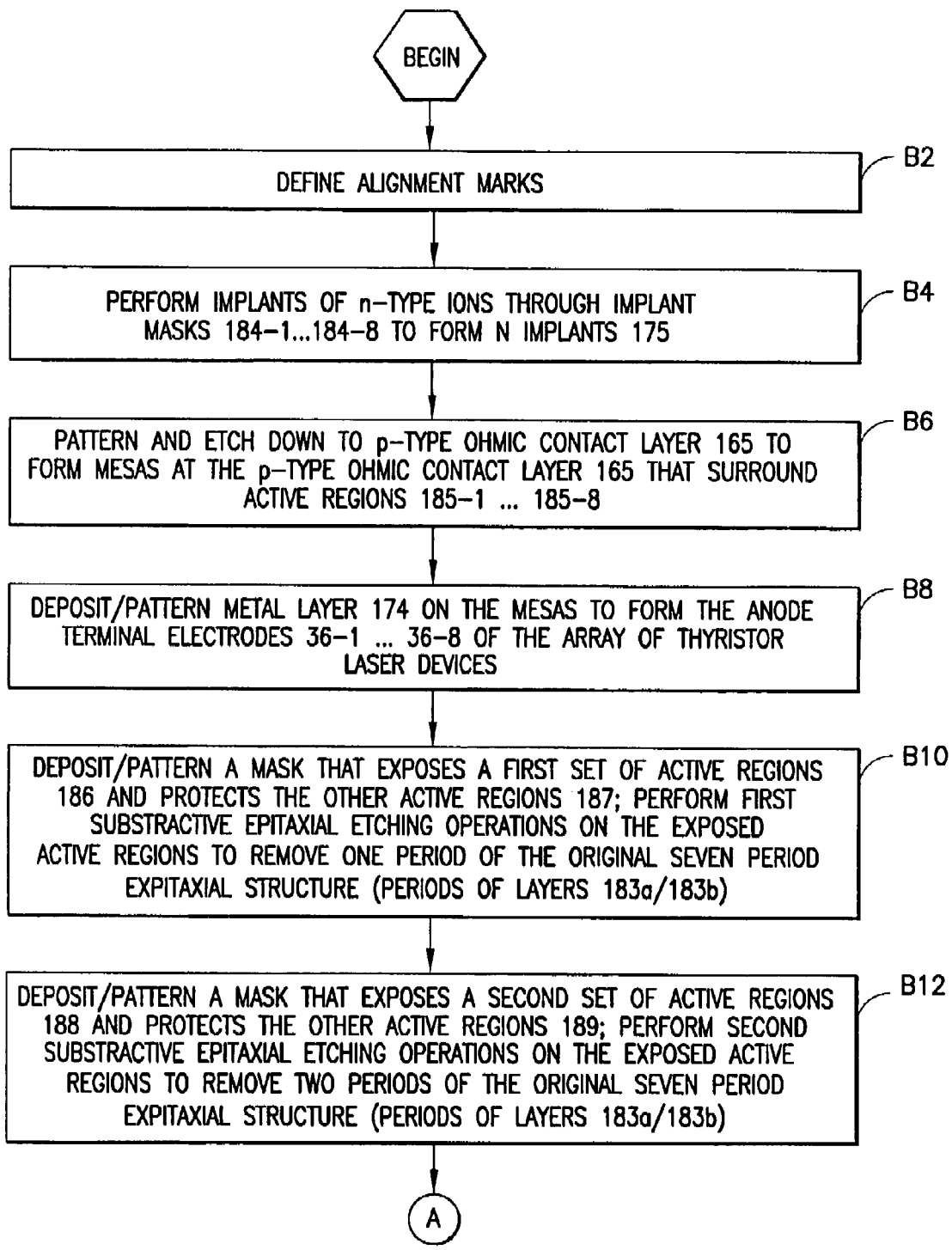
FIGS. 4A and 4B, collectively, are a flow chart illustrating an exemplary methodology of fabricating the multilayer structure of FIG. 3 to form the multiple wavelength thyristor array in accordance with the present invention.
Figure 4B:
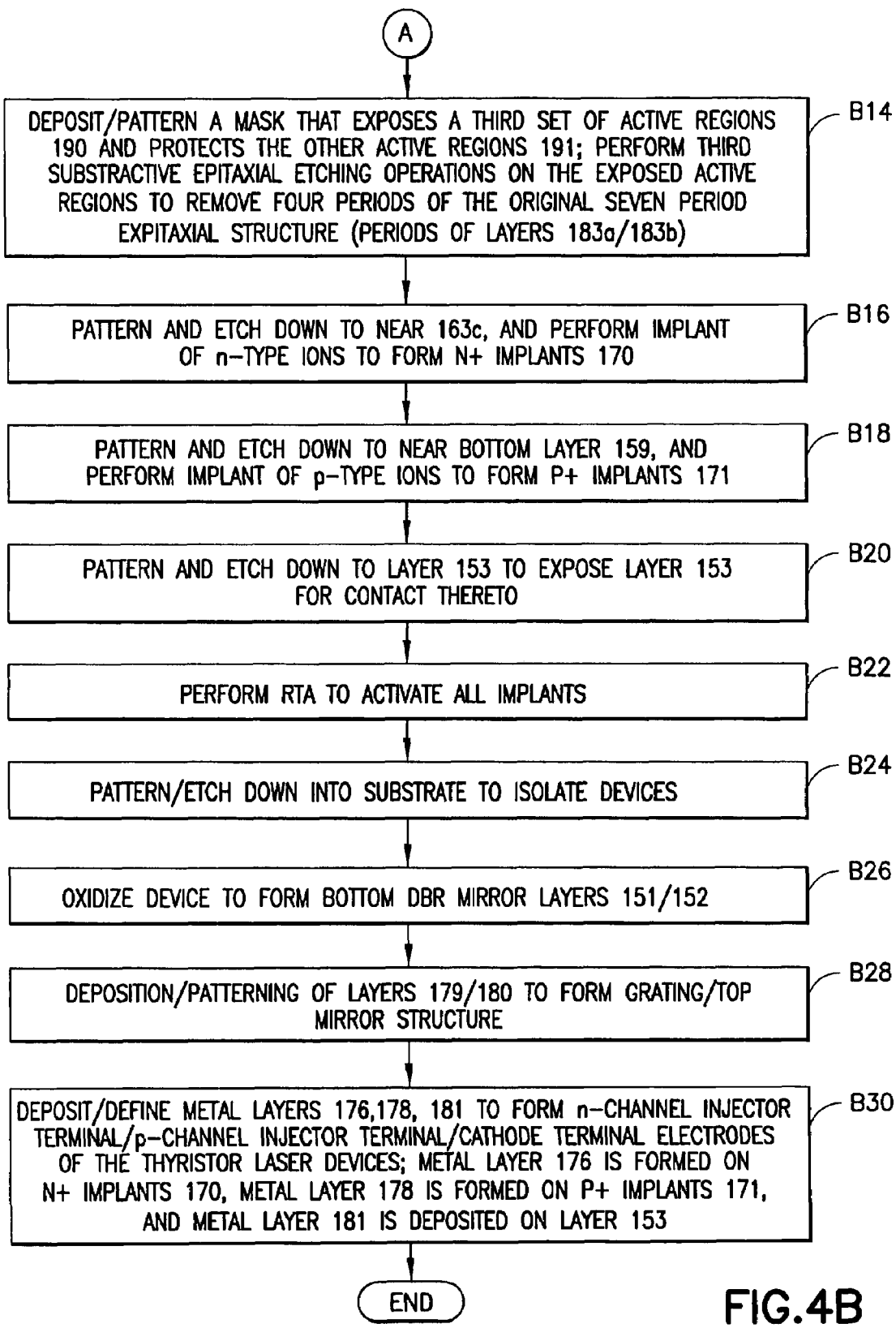
Figure 5A:
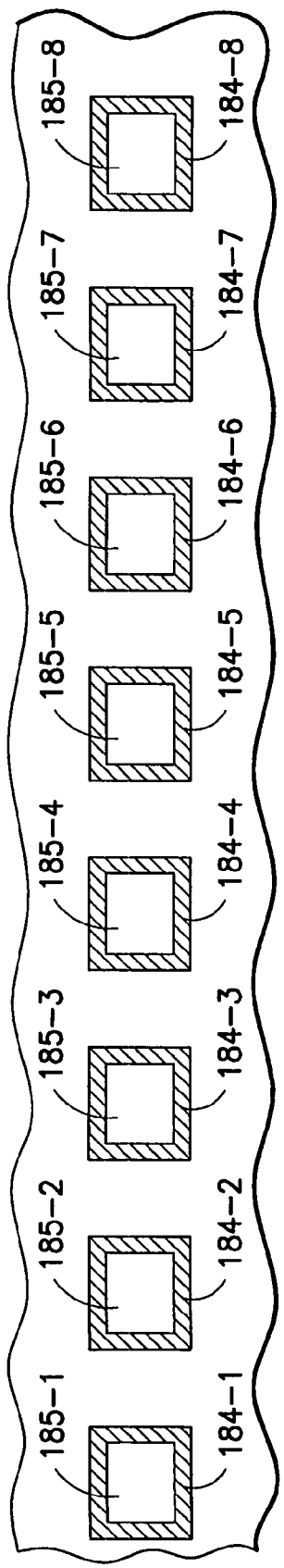
FIGS. 5A–5E are plan views illustrating different steps during the fabrication methodology of FIGS. 4A and 4B.

FIGS. 4A and 4B in conjunction with FIGS. 5A–5E illustrate an exemplary method of fabricating the epitaxial growth structure of FIG. 3 to form an array of eight multi-wavelength thyristor devices on the common substrate. The methodology begins in block B2 by defining alignment marks in the structure. In block B4, the alignment marks are used to perform an implant of n-type ions through implant masks 184-1, 184-2 . . . 184-8 as shown in FIG. 5A. The implant operation is performed through the implant masks 184-1 . . . 184-8 and through the periodic layer structure and P+-type ohmic contact layers 165*a*, 165*b* to form the N-type implants 175 for each one of the eight thyristor devices. Preferably, the N-type implants 175 are implanted to a depth near layer 162.

In block B6, the structure is patterned and etched to form mesas at the P+-type ohmic contact layer 165*b* that surround the active regions 185-1, 185-2 . . . 185-8 for the eight thyristor devices as shown in FIG. 5A. A portion of the mesas at the P+-type ohmic contact layer 165*b* cover the N-type implants 175.

Figure 5B:
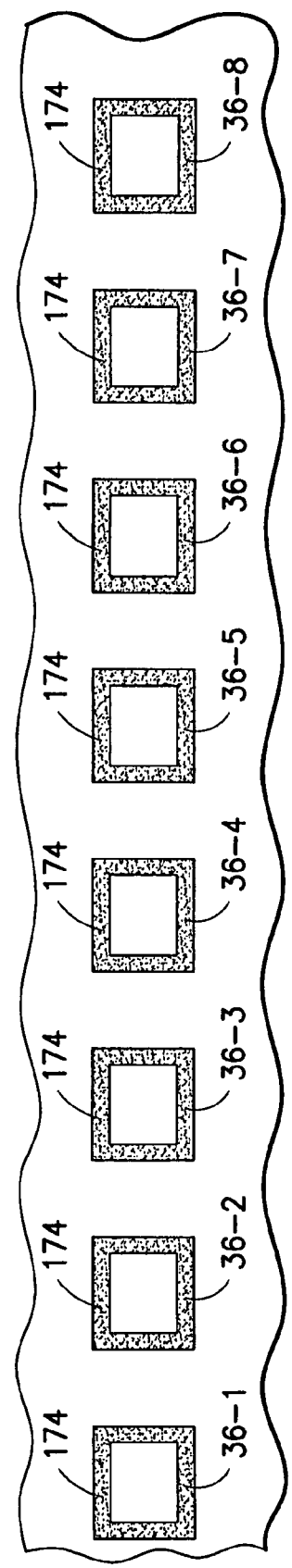
Figure 6A:
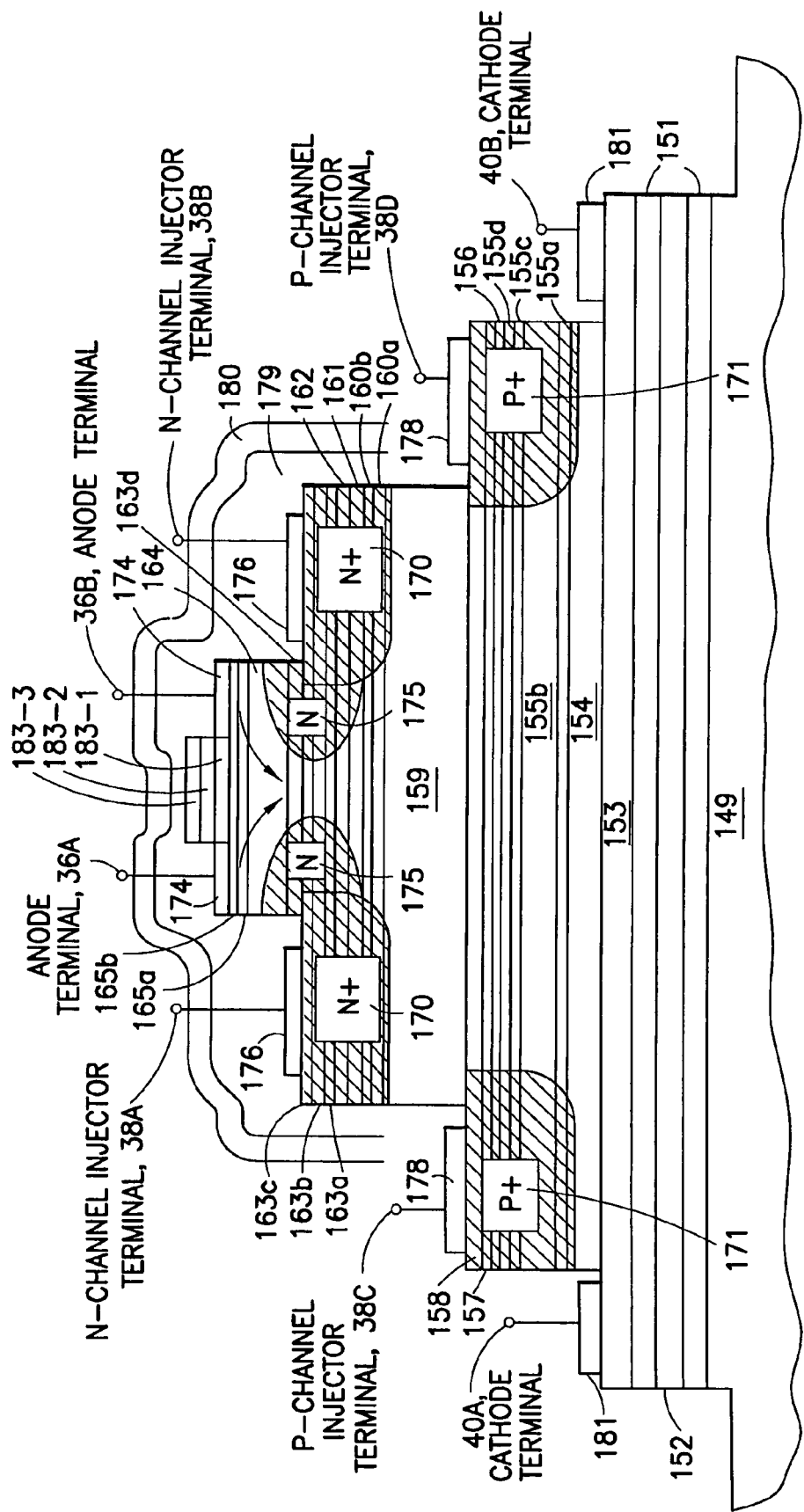
FIGS. 6A and 6B are schematic views showing the generalized construction of two exemplary resonant cavity thyristor devices formed from the layer structure of FIG. 3.
Figure 6B:
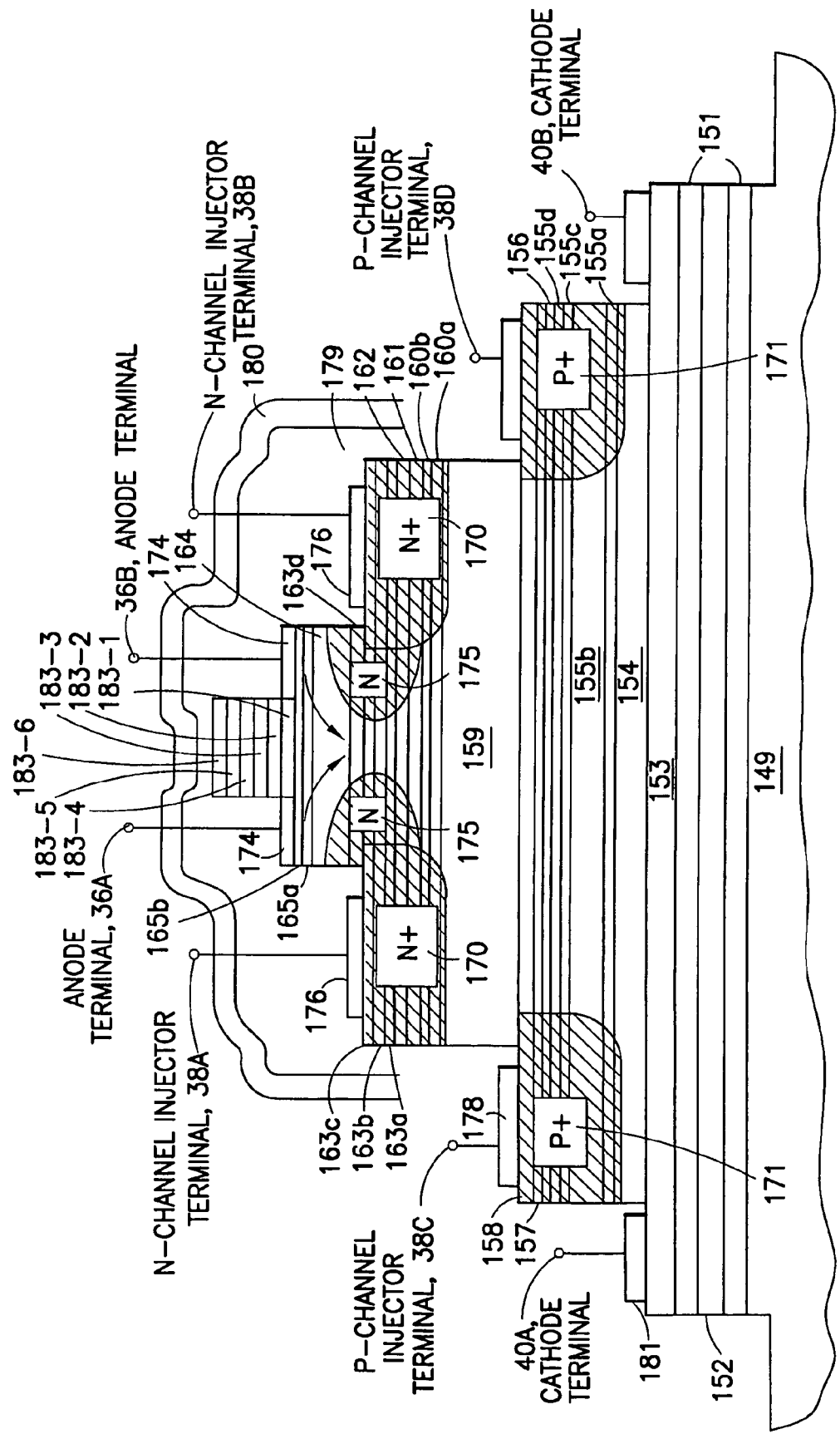

In block B8, a metal layer 174 (preferably comprising tungsten) is deposited and defined to form electrodes for the various devices. As part of block B6, metal layer 174 is deposited on the mesas in the P+-type ohmic contact layer 165*b* to form the anode terminal electrodes 36-1, 36-2 . . . 36-8 for the eight thyristor devices as shown in FIG. 5B. A portion of the metal layer 174 covers the N-type implants 175 as best shown in FIGS. 6A and 6B. The metal layer 174 is also deposited on the ohmic contact layer 165*b* to form the gate terminal electrode of each n-channel HFET device integrally formed on the substrate 149 and/or to form the emitter terminal electrode for each n-type quantum-well-base bipolar transistor device integrally formed on the substrate 149.

Figure 5C:
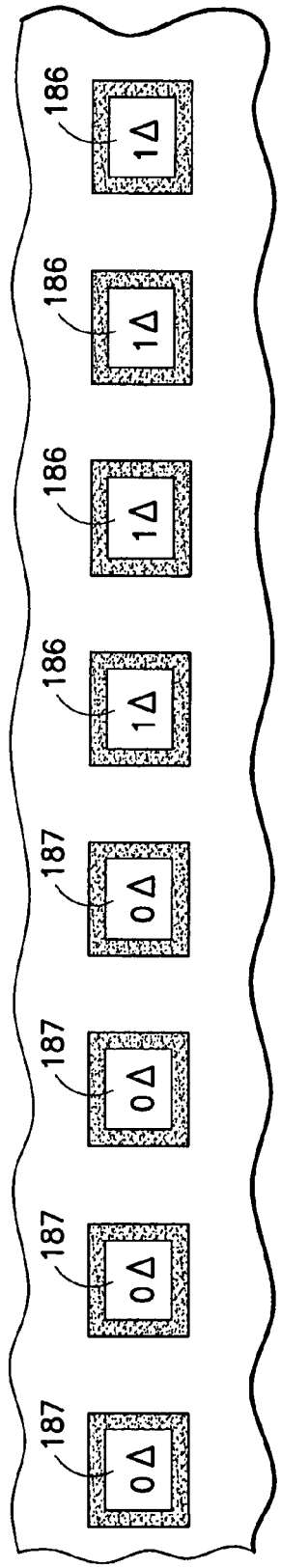

In block B10, a mask is deposited and patterned to expose a first set of active regions (labeled 186) for the eight thyristor devices and protect the remaining active regions (labeled 187) for the eight thyristor devices as shown in FIG. 5C. The structure is then subject to an etchant that removes one period of the original seven period epitaxial structure (periods of layers 183a/183b) in the exposed active areas. Preferably, a chlorine-based gas mixture that includes fluorine is used as the etchant to etch down to the second AlAs layer 183b (e.g., the AlAs layer 183b for the sixth period of the original seven period epitaxial structure). This AlAs layer 183b is then easily dissolved in de-ionized (DI) water or wet buffered hydrofluoric acid (BHF) to expose the undoped GaAs layer 183a thereunder (e.g., the GaAs layer 183a for the sixth period of the original seven period epitaxial structure).

Figure 5D:
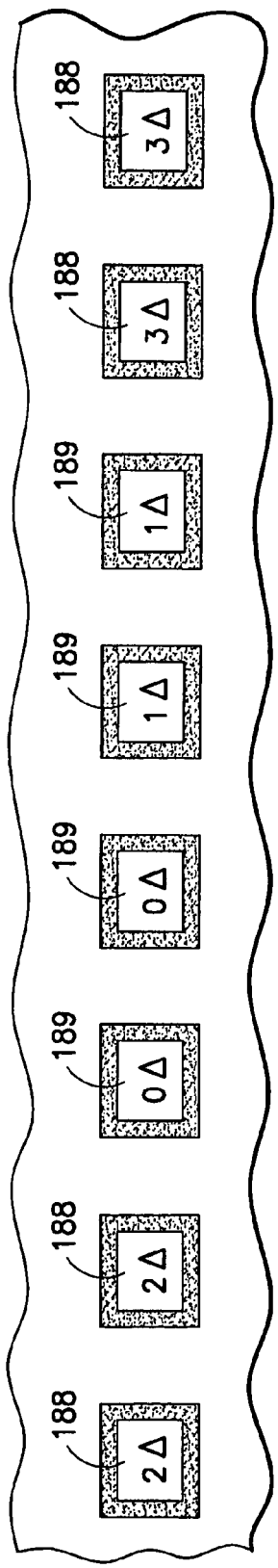
Figure 5E:
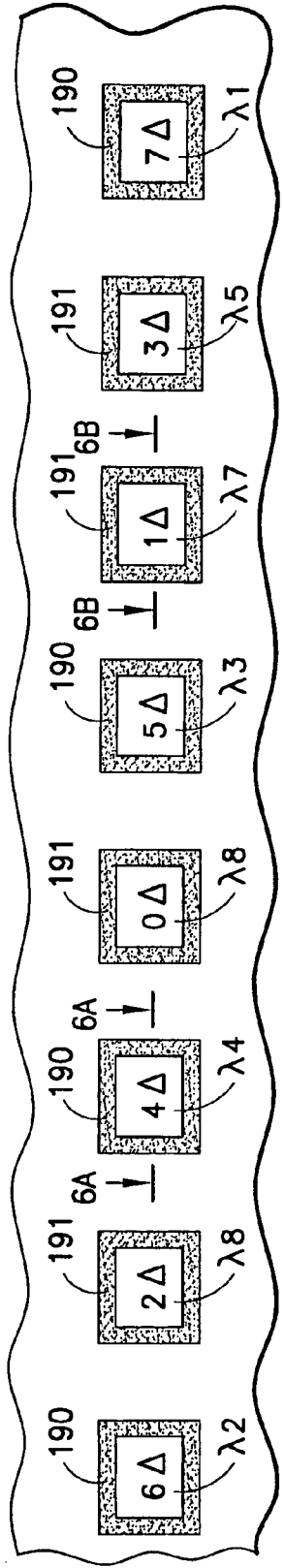

In block B12, a mask is deposited and patterned to expose a second set of active regions (labeled 188) for the eight thyristor devices and protect the remaining active regions (labeled 189) for the eight thyristor devices as shown in FIG. 5D. The structure is then subject to an etchant that removes two periods of the original seven period epitaxial structure (periods of layers 183a/183b) in the exposed active areas. Preferably, a chlorine-based gas mixture that includes fluorine is used as the etchant to etch down to the AlAs layer 183b for the desired period of the original seven period epitaxial structure). This AlAs layer 168b is then easily dissolved in de-ionized (DI) water or wet buffered hydrofluoric acid (BHF) to expose the undoped GaAs layer 183a thereunder.

In block B14, a mask is deposited and patterned to expose a third set of active regions (labeled 190) for the eight thyristor devices and protect the remaining active regions (labeled 191) for the eight thyristor devices as shown in FIG. 5F. The structure is then subject to an etchant that removes four periods of the original seven period epitaxial structure (periods of layers 183a/183b) in the exposed active areas. Preferably, a chlorine-based gas mixture that includes fluorine is used as the etchant to etch down to the AlAs layer 183b for the desired period of the original seven period epitaxial structure). This AlAs layer 168b is then easily dissolved in de-ionized (DI) water or wet buffered hydrofluoric acid (BHF) to expose the undoped GaAs layer 183a thereunder. At the conclusion of the operations of block B14, the height dimensions of the original seven period epitaxial structure (periods of layers 183a/183b) in the active areas of the eight thyristor devices have adjusted (via the selective etching operations of blocks B10, B12, B14) to correspond to the eight different optical path lengths (and eight different wavelengths $\lambda_1 \ldots \lambda_8$) for the eight thyristor laser devices of the array. For example, with respect to $\lambda_1$ thyristor device, all seven periods of the original seven period epitaxial structure, e.g., seven periods of layers 183a/183b, in the active area of the $\lambda_1$ thyristor device are etched away during the etching operations of blocks B10, B12, B14 to form an optical path length that corresponds to $\lambda_1$. With respect to the $\lambda_3$ thyristor device, five periods of the original seven period epitaxial structure, e.g., five periods of layers 183a/183b, in the active area of the 3 thyristor device are etched away during the etching operations of blocks B10 and B14 to form an optical path length that corresponds to $\lambda_3$. With respect to the $\lambda_8$ thyristor device, zero periods of the original seven period epitaxial structure, zero periods of layers 183a/183b, in the active area of the $\lambda_8$ thyristor device are etched away during the etching operations of blocks B10, B12 and B14 to form an optical path length that corresponds to $\lambda_8$.

In block B16, the resulting structure of block B14 is patterned and etched to expose regions at (or near) layer 163c. An implant of n-type ions is implanted into the exposed regions to form N+-type implants 170, which are used to contact to the n-type QW structure 24 for the eight thyristor devices of the array (as best shown in FIGS. 6A and 6B). The N+-type implants 170 are also used to form source and drain channel contacts in each n-channel HFET device integrally formed on the substrate 149 and/or to form a base contact in each n-type quantum-well-base bipolar transistor device integrally formed on the substrate 149. Advantageously, the N+-type implants 170 are self-aligned by the anode terminal electrodes formed on the mesas above the implants 170 as shown in FIGS. 6A and 6B.

In block B18, the resultant structure of block B16 is subject to an etching operation that exposes regions preferably at or near layer 158. An implant of p-type ions is implanted into the exposed regions to form the P+-type implants 171, which are used to contact to the p-type QW structure 20 (layers 155–158) for the eight thyristor devices (as best shown in FIGS. 6A and 6B). The P+-type implants 171 are also used to form the collector contact for each n-channel HFET devices integrally formed on the substrate 149, to form the source and drain channel contacts for each p-channel HFET device integrally formed on the substrate 149, to form the base contact for each p-type quantum-well-base bipolar transistor device integrally formed on the substrate 149, and/or to form the collector contact for each n-type quantum-well-base bipolar transistor device integrally formed on the substrate 149.

In block B20, the resultant structure of block B18 is subject to a patterning and etching operation that exposes regions of ohmic contact layer 153. The exposed regions of layer 153 are used to form a low resistance contact to the cathode terminal electrodes 40a, 40b for the eight thyristor devices as shown in FIG. 6A and 6B. The exposed regions of layer 153 are also used to form gate electrode for each p-channel HFET device integrally formed on the substrate 149, and/or to form the emitter electrode for each p-type quantum-well-base bipolar transistor device integrally formed on the substrate 149.

In block B22, the structure is subjected to a rapid thermal anneal (RTA) of the order of 950° C. to activate all implants.

In block B24, the devices are isolated from one another by an etch operation down to the semi-insulating substrate 149, which includes an etch through the mirror pairs 151/152 of AlAs/GaAs.

In block B26, the structure is oxidized in a steam ambient to convert layers 151 to AlO, which form the bottom DBR mirror 12. During this oxidation step, the exposed sidewalls of the etched AlGaAs layers are passivated by the formation of very thin layers of oxide.

In block B28, layers 179/180 are deposited to form a top dielectric mirror. Preferably, the layers 179/80 comprise $SiO_2$ and a high refractive index material such as GaAs, Si, or GaN. In addition, a diffraction grating may be formed in conjunction with the formation of the top dielectric mirror as described in detail in U.S. Pat. No. 6,031,243.

Finally, in block B30, metal layers 176, 178 and 181 are deposited and defined (preferably via lift off). Metal layer 176 (which preferably comprises an n-type Au alloy metal such as AuGe/Ni/Au) is deposited on the N+ type implants 170 to form the N-channel injector terminal electrodes 38a, 38*b* of the thyristor devices as shown in FIGS. 6A and 6B. Metal layer 178 (which preferably comprises a p-type Au metal alloy such as AuZn/Cr/Au) is deposited on the P+ type implants 171 to form the p-channel injector terminal electrodes 38*c*, 38*d* of the thyristor devices as shown. Metal layer 181 (which preferably comprises an n-type Au alloy metal such as AuGe/Ni/Au) is deposited on the mesas at the N+ layer 153 to form the cathode terminal electrodes 40A, 40B of the thyristor devices as shown. Metal layer 176 may also be used to form the source terminal electrode and drain terminal electrode of each n-channel HFET device integrally formed on the substrate 149, to form the base terminal electrode of each n-type quantum-well-base bipolar transistor device integrally formed on the substrate 149, and/or to form the collector terminal electrode of each p-type quantum-well-base bipolar transistor device integrally formed on the substrate 149. Metal layer 178 may also be used to form the source terminal electrode and drain terminal electrode of each p-channel HFET device integrally formed on the substrate 149, to form the base terminal electrode of each p-type quantum-well-base bipolar transistor device integrally formed on the substrate 149, and/or to form the collector terminal electrode of each n-type quantum-well-base bipolar transistor device integrally formed on the substrate 149. Metal layer 181 may also be used to form the gate terminal electrodes of each p-channel HFET device integrally formed on the substrate 149, and/or to form the emitter terminal electrode of each p-type quantum-well-base bipolar transistor device integrally formed on the substrate 149.

FIG. 6A is a cross-section view illustrating the thyristor device of the array which corresponds to a wavelength $\lambda_4$ (of the eight different wavelengths $\lambda_1 \ldots \lambda_8$ of the thyristor devices of the array). This device has three periods (183-1, 183-2, and 183-3) remaining from the original seven period structure as a result of the selective etching operations of blocks B10, B12 and B14 (FIG. 4A).

FIG. 6B is a cross-section view illustrating the thyristor device of the array which corresponds to a wavelength $\lambda_7$ (of the eight different wavelengths $\lambda_1 \ldots \lambda_8$ of the thyristor devices of the array). Note that this device has six periods (183-1 ... 183-6) remaining from the original seven period structure as a result of the selective etching operations of blocks B10, B12 and B14 (FIG. 4A).

Advantageously, and as previously described, the selective etching operations of blocks B10, B12 and B14 utilize three masks to define the eight different wavelengths $\lambda_1 \ldots \lambda_8$ of the thyristor devices of the array. This minimizes the cost of manufacturing the array. It should be appreciated that the 7-period epitaxial growth structure and associated 3-mask etching operation may be readily expanded to provide for a larger number of wavelengths/devices. For example, a 15-period epitaxial growth structure and associated 4-mask etching operation may be used to provide for 16 different wavelengths/devices, while a 31-period epitaxial growth structure and associated 5-mask etching operation may be used to provide for 32 different wavelengths/devices. Note that this may be generalized by the following relationship: a $(2^X-1)$ period epitaxial growth structure and associated X-mask etching operation may be used to provide for $2^X$ different wavelengths/devices, where X is an integer greater than 1.

FIG. 7 illustrates the operational characteristics of the thyristor devices of the thyristor array described herein. The thyristor switches from a non-conducting/OFF state (where the current I through the device is substantially zero) to a conducting/ON state (where the current I is substantially greater than zero) when: i) the anode terminals 36*a*, 36*b* are forward biased (e.g. biased positively) with respect to the cathode terminals 40*a*, 40*b*; and ii) the voltage between injector electrode(s) and anode electrode is biased for a period long enough to produce a charge in the N-type modulation doped QW heterostructure 24 (and/or produce a charge in the P-type modulation doped QW heterostructure 20) that is greater than the critical switching charge $Q_{CR}$, which is that charge that reduces the forward switching voltage such that no off state bias point exists.

The thyristor device can also be switched into the ON state with optical energy. More specifically, the thyristor device is switched from a non-conducting/OFF state (where the current I through the device is substantially zero) to a conducting/ON state (where the current I is substantially greater than zero) when: i) the anode terminals 36*a*, 36*b* are forward biased (e.g. biased positively) with respect to the cathode terminals 40*a*, 40*b*; and ii) optical energy is introduced into the quantum well structure(s) of the device that is sufficient to produce the critical switching charge $Q_{CR}$.

As an optoelectronic component, the thyristor is multifunctional. If the current I in the conducting/ON state is above the threshold for lasing ($I_L$), then laser emission will occur. This is the operation of a semiconductor laser. It can be activated with electrical signals supplied to the injector terminal(s) of the device as well as optical energy injected into the device. This configuration is preferably achieved by applying a forward bias between the anode and cathode terminals that is less than the maximum forward switching voltage of the device. In addition, the injector terminal(s) of the device are biased with respect to the anode terminal through a current source that generates a bias current $I_{BIAS}$. When an input electrical pulse is supplied to the injector terminal(s) of the device (or an optical pulse is supplied to device), in the event that the supplied pulse has sufficient energy to produce current in excess of the bias current $I_{BIAS}$ drawing on the injector terminal(s) and such current produces the critical switching charge $Q_{CR}$, the thyristor will switch to its conducting/ON state. In the ON state, if the current I is above the threshold for lasing ($I_L$), then laser emission will occur to produce an output optical pulse that is emitted from the device. When the input pulse is reduced, the thyristor will switch to the OFF state because the bias current $I_{BIAS}$ provided by the current source to the injector terminal(s) drains the QW channel(s) of charge, which causes the channel charge to fall below the holding charge $Q_H$. In the OFF state, the current I through the device is near zero, thereby terminating the corresponding output optical pulse emitted from the device. In this manner, the thyristor device can be configured to operate as a vertical cavity laser that produces an output optical pulse (in response to an input electrical/optical pulse).

The thyristor device can be configured to operate as an optical detector that detects an input optical pulse and produces a corresponding output electrical pulse (or output optical pulse) in response to a detected input optical pulse. In this configuration, the thyristor device is in the non-conducting/OFF state and functions as an optical detector when light is admitted into the cavity in the sense that when sufficient electron-hole pairs have been generated to produce the critical switching charge $Q_{CR}$, the thyristor will switch to its ON state. In the ON state, the device produces an electrical output pulse (and possibly an output optical pulse). This configuration is achieved by applying a forward bias between the anode and cathode terminals that is less than the maximum forward switching voltage of the device. In addition, the injector terminal(s) of the device are biased with respect to the anode terminal through a current source that generates a bias current $I_{BIAS}$. When an input optical pulse is incident on the thyristor, in the event that the incident light has sufficient intensity to produce photocurrent in excess of the bias current $I_{BIAS}$ drawing on the injector terminal(s) and such photocurrent produces the critical switching charge $Q_{CR}$, the thyristor will switch to its conducting/ON state. In the ON state, the current I through the device produces a corresponding output electrical pulse at the cathode terminal (and/or at the anode terminal) of the device. When the incident light is reduced, the thyristor will switch to the OFF state because the bias current $I_{BIAS}$ provided by the current source to the injector terminal(s) drains the QW channel(s) of charge, which causes the channel charge to fall below the holding charge $Q_H$. In the OFF state, the current I through the device is near zero, thereby terminating the corresponding output pulse produced at the cathode terminal (and/or the anode terminal) of the device. When the thyristor device is configured as a vertical cavity detector, the current through the device in the ON state may be set above the threshold for lasing. This configuration is referred to herein as an optical detector/emitter. It operates as a vertical cavity laser that produces an output optical pulse in response to the detection of a corresponding input optical pulse.

In addition, the thyristor device can be configured to operate as various other optoelectronic components including a PIN detector, digital optical modulator, analog optical modulator, and optical amplifier as described below.

A PIN detector generates an electrical signal proportional to the optical signal incident thereon. To configure the thyristor device as a PIN detector, the cathode terminals 40a, 40b float electrically and a reverse bias is applied between the n-channel injector terminals 38a, 38b and the anode terminals 36a, 36b. Such a configuration creates a reverse-bias PIN junction that generates an electrical signal (photocurrent) proportional to the optical signal incident to the vertical cavity.

A digital optical modulator operates in one of two distinct optical states in modulating an input optical signal. In optical state 1, there is no loss to input optical signal via absorption. In optical state 2, all of the input optical signal is absorbed. To configure the thyristor device as a digital optical modulator, an optical path is provided through the device either vertically or in the waveguide mode, and an input signal is applied to the n-channel injector terminal 38a, 38b with respect to the anode terminals 36a, 36b.

When the input signal produces a forward bias between the n-channel injector terminals 38a, 38b and the anode terminals 36a, 36b sufficient to produce charge in the N-type modulation doped QW heterostructure 24 greater than the critical switching charge $Q_{CR}$, the thyristor operates in its conducting/ON state. The device is biased such that the current I through the device in the ON state is substantially below the threshold for lasing (preferably about one-third of the lasing threshold current). In this configuration, in the ON state, the device operates in optical state 1 whereby there is no loss to input optical signal via absorption.

When the input signal produces a reverse bias between the n-channel injector terminals 38a, 38b and the anode terminals 36a, 36b which draws current from the anode terminals sufficient to decrease the charge in the N-type modulation doped QW heterostructure 24 below the hold charge $Q_H$, the thyristor operates in its non-conducting/OFF state. In the OFF state, the device operates in optical state 2 whereby all of the input optical signal is absorbed.

An analog optical modulator modulates an input optical signal linearly over a range of modulation values. To configure the thyristor device structure as an analog optical modulator, the cathode terminals 40a, 40b float electrically and the thyristor function is deactivated. An optical path is provided through the device either vertically or in the waveguide mode, and an input signal is applied to the anode terminals 36a, 36b with respect to the n-channel injector terminals 38a, 38b such that the anode terminals 36a, 36b are biased positively with respect to the n-channel injector terminals 38a, 38b. In this configuration, the voltage at the anode terminals 36a, 36b is varied over a range of voltage levels where absorption of the device varies linearly. The top of the voltage range (where minimum absorption occurs) is defined by the operation point where conduction occurs from the anode terminals 36a, 36b to the injector terminals 38a, 38b.

An optical amplifier amplifies an input optical signal to produce a corresponding output optical signal with an increased intensity level. To configure the thyristor device as an optical amplifier, the diffraction grating is omitted and an input optical signal is injected into the optically-active region of the device. A forward bias is applied between the anode and cathode terminals through a load resistance that sets the current I through the device in the ON state at a point substantially below the lasing threshold $I_L$. In this configuration, in the ON state, the device amplifies the input optical signal to produce a corresponding output optical signal with an increased intensity level. The optical amplifier may be switched into and out of the ON state by applying forward and reverse biases to the n-channel injector terminals 38a, 38b with respect to the anode terminals 36a, 36b as described above. The gain of the optical amplifier in the ON state and thus the output signal intensity level may be changed by adjusting the current I in the ON state.

In this manner, the array of thyristor devices as described herein may be used to realize an array of devices that provide a variety of optoelectronic functions. For example, to realize an array of thyristor-based lasers that emit light at different wavelengths (e.g., for wavelength-division-multiplexing applications), the array of thyristor devices is formed such that the vertical dimensions of the resonant cavities for the thyristor devices corresponds to the desired wavelengths. In another example, to realize an array of thyristor-based detectors that detect light at different wavelengths (e.g., for wavelength-division-multiplexing applications), the array of thyristor devices is formed such that the vertical dimensions of the resonant cavities for the thyristor devices corresponds to the desired wavelengths. Incident light (which includes light components at the different wavelengths) is guided to the array of thyristor devices. Each thyristor device is biased such that the incident light component of a particular wavelength (e.g., an ON light pulse at the particular wavelength) will be resonantly absorbed and switch the device into its ON state, which produces a corresponding output electrical signal. In the ON state, the device may produce a corresponding output optical signal via lasing action if the device is biased such that the current I in the ON state is above the threshold for lasing $I_L$. Similarly, the array of multi-wavelength thyristor devices can be used to realize an array of PIN detector devices that detect incident light at different wavelengths, an array of optical modulator devices that modulate incident light at different wavelengths, and an array of optical amplifier devices that amplify incident light at different wavelengths.

In addition, the multilayer structures of FIGS. 1 and 3 may be used to realize various transistor devices (such as n-channel HFETs, p-channel HFETs, p-type quantum-well-base bipolar transistors, n-type quantum-well-base bipolar transistors), waveguide devices, and other optoelectronic devices (such as optical interconnects). The details of such devices are described in the previously incorporated patent applications. Thus, the multi-wavelength thyristor array as described herein is well suited for monolithic integration with a broad range of electronic devices and optoelectronic devices (such as n-channel HFETs, p-channel HFETs, p-type quantum-well-base bipolar transistors, n-type quantum-well-base bipolar transistors, waveguide devices, and other optoelectronic devices such as optical interconnects).

There have been described and illustrated herein several embodiments of a multi-wavelength thyristor array employing modulation doped quantum well structures and a method of fabricating such multi-wavelength thyristor arrays. While particular embodiments of the invention have been described, it is not intended that the invention be limited thereto, as it is intended that the invention be as broad in scope as the art will allow and that the specification be read likewise. Thus, while particular layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. Additionally, while particular formation and metallization techniques have been described, it will be appreciated that the described structures can be formed in other manners, and other metals used to form terminals. Further, while particular arrangements of thyristor devices, optical emitters, detectors, modulators, amplifiers, etc. formed from the described semiconductor structure, it will be appreciated that other devices and circuits can be made from the provided structure and components. It will therefore be appreciated by those skilled in the art that yet other modifications could be made to the provided invention without deviating therefrom.

What is claimed is:

1. An optoelectronic integrated circuit comprising:
   a) a substrate;
   b) a multilayer structure formed on said substrate; and
   c) an array of thyristor devices and corresponding resonant cavities formed in said multilayer structure, said resonant cavities adapted to process different wavelengths of light;
   wherein said multilayer structure includes a top contact layer, a substructure formed above said top contact layer, and a top mirror formed above said substructure, portions of said substructure being selectively removed to provide said resonant cavities with different vertical dimensions that correspond to said different wavelengths.

2. An optoelectronic circuit according to claim 1, wherein:
   said substructure comprises a periodic substructure formed by repeating pairs of an undoped spacer layer and an undoped etch stop layer.

3. An optoelectronic integrated circuit according to claim 2, wherein:
   said multilayer structure comprises strained silicon materials.

4. An optoelectronic integrated circuit according to claim 2, wherein:
   said multilayer structure comprises group III-V materials.

5. An optoelectronic integrated circuit according to claim 4, wherein
   said undoped spacer layer comprises undoped GaAs, and said undoped etch stop layer comprises undoped AlAs that functions as an etch stop during etching by a chlorine-based gas mixture that includes fluorine.

6. An optoelectronic integrated circuit according to claim 1, wherein:
   each given thyristor device of said array is configured as a vertical cavity lasing device to thereby provide an array of vertical cavity lasing devices that emit light at different wavelengths.

7. An optoelectronic integrated circuit according to claim 1, wherein:
   each given thyristor device of said array is configured as an optical detecting device to thereby provide an array of optical detectors that detect input optical pulses at different wavelengths and produces corresponding output pulses.

8. An optoelectronic integrated circuit according to claim 7, wherein:
   said output pulses are electrical output pulses that correspond to detected input optical pulses at different wavelengths.

9. An optoelectronic integrated circuit according to claim 7, wherein:
   said output pulses are optical output pulses that correspond to detected input optical pulses at different wavelengths.

10. An optoelectronic integrated circuit according to claim 1, wherein:
    each given thyristor device of said array comprises a n-type modulation doped quantum well structure and a p-type modulation doped quantum well structure.

11. An optoelectronic integrated circuit according to claim 10, further comprising:
    a current source operably coupled to at least one of said n-type modulation doped quantum well structure and a p-type modulation doped quantum well structure.

12. An optoelectronic integrated circuit according to claim 11, wherein:
    each given thyristor device comprises a p-channel FET transistor formed on said substrate and an n-channel FET transistor formed atop said p-channel FET transistor, said p-channel FET transistor formed from said p-type modulation doped quantum well structure and said n-channel FET transistor formed from said n-type modulation doped quantum well structure.

13. An optoelectronic integrated circuit according to claim 12, wherein:
    said p-channel FET transistor includes a bottom contact layer,
    said n-channel FET transistor includes said a top contact layer, and
    said given thyristor device further comprises an anode terminal operably coupled to said top contact layer, a cathode terminal operably coupled to said bottom contact layer, and an injector terminal operably coupled to at least one of said n-type modulation doped quantum well structure and said p-type doped p-type quantum well structure.

14. An optoelectronic integrated circuit according to claim 13, wherein:
    said injector terminal is operably coupled to said n-type modulation doped quantum well structure via at least one n-type ion implant into said n-type modulation doped quantum well structure.

15. An optoelectronic integrated circuit according to claim 13, wherein:
   said injector terminal is operably coupled to said p-type modulation doped quantum well structure via at least one p-type ion implant into said p-type modulation doped quantum well structure.

16. An optoelectronic integrated circuit according to claim 13, wherein:
   said given thyristor device further comprises a metal layer for said anode terminal that is formed on said top contact layer, and a plurality of p-type layers formed between said top contact layer and said n-type modulation doped quantum well structure.

17. An optoelectronic integrated circuit according to claim 16, further comprising:
   n-type implants disposed below said metal layer for said anode terminal to thereby provide for current funneling into an active area of said given thyristor device.

18. An optoelectronic integrated circuit according to claim 16, wherein:
   said plurality of p-type layers are separated from said n-type modulation doped quantum well structure by undoped spacer material.

19. An optoelectronic integrated circuit according to claim 16, wherein:
   said plurality of p-type layers include a top sheet and bottom sheet of planar doping of highly doped p-material separated by a lightly doped layer of p-material, whereby said top sheet achieves low gate contact resistance and said bottom sheet defines the capacitance of said n-channel FET transistor.

20. An optoelectronic integrated circuit according to claim 13, further comprising:
   a current source operably coupled to said injector terminal that draws bias current from a quantum well structure coupled thereto, and
   a load resistor operably coupled to said cathode terminal that biases said thyristor device such that a forward bias exists between said anode and cathode terminals that is less than maximum forward switching voltage of the thyristor device.

21. An optoelectronic integrated circuit according to claim 20, wherein:
   said given thyristor device is configured as an optical detector that detects an incident optical pulse of sufficient intensity at an associated wavelength and produces a corresponding output electrical pulse at the cathode terminal of said given thyristor device.

22. An optoelectronic integrated circuit according to claim 20, wherein:
   said given thyristor device is configured such that when said incident optical pulse has sufficient intensity at the associated wavelength, photocurrent is produced in said quantum well channel in excess of said bias current to produce a channel charge that exceeds a critical switching charge, thereby causing said thyristor device to switch to the ON state, and when the incident optical pulse is terminated, the bias current switches the thyristor device to the OFF state.

23. An optoelectronic integrated circuit according to claim 20, wherein:
   said given thyristor device is configured as a laser emitter that emits an output optical pulse at an associated wavelength in response to an input electrical pulse supplied to the injector terminal.

24. An optoelectronic integrated circuit according to claim 20, wherein:
   said given thyristor device is configured such that said input electrical pulse produces current in said quantum well channel in excess of said bias current to produce a channel charge that exceeds a critical switching charge, thereby causing said thyristor device to switch to the ON state, and when the input electrical pulse is terminated, the bias current switches the thyristor device to the OFF state, and wherein current through the given thyristor device in the ON state is greater than a characteristic lasing threshold current for the given thyristor device.

25. An optoelectronic integrated circuit according to claim 1, wherein:
   said resonant cavities comprise a bottom distributed bragg reflector mirror and a top dielectric mirror.

26. An optoelectronic integrated circuit according to claim 25, wherein:
   said thyristor devices are formed from an active device structured disposed between said bottom distributed bragg reflector mirror and said top dielectric mirror, and said substructure is disposed between said active device structure and said top dielectric mirror.

27. An optoelectronic integrated circuit according to claim 25, further comprising:
   means for passing light through one of said top dielectric mirror and said bottom distributed bragg reflector mirror through which incident light is injected into said resonant cavity and/or through which light produced in said resonant cavity is emitted.

28. An optoelectronic integrated circuit according to claim 25, further comprising:
   a plurality of diffraction gratings formed under said top dielectric mirror, wherein said diffraction gratings inject incident light that is propagating along an in-plane direction into the resonant cavities, and emits light produced in the resonant cavities along an in-plane direction.

29. A method of fabricating an optoelectronic integrated circuit comprising:
   a) providing a substrate;
   b) forming a multilayer structure on said substrate; and
   c) forming an array of thyristor devices and corresponding resonant cavities in said multilayer structure, said resonant cavities adapted to process different wavelengths of light, wherein said multilayer structure includes a top contact layer, a substructure formed above said top contact layer, and a top mirror formed above said substructure, and wherein portions of said substructure are selectively removed to provide said resonant cavities with different vertical dimensions that correspond to said different wavelengths.

30. A method of fabricating an optoelectronic integrated circuit according to claim 29, wherein:
   said substructure multilayer structure comprises a periodic substructure formed by repeating pairs of an undoped spacer layer and an undoped etch stop layer.

31. A method of fabricating an optoelectronic integrated circuit according to claim 30, further comprising:
   selectively removing portions of said periodic substructure to provide said resonant cavities with different vertical dimensions that correspond to said different wavelengths.

32. A method of fabricating an optoelectronic integrated circuit according to claim 30, wherein:
said multilayer structure comprises strained silicon materials.

33. A method of fabricating an optoelectronic integrated circuit according to claim 30, wherein:
said multilayer structure comprises group III-V materials.

34. A method of fabricating an optoelectronic integrated circuit according to claim 33, wherein:
said undoped spacer layer comprises undoped GaAs, and said undoped etch stop layer comprises undoped AlAs that functions as an etch stop during etching by a chlorine-based gas mixture that includes fluorine.

35. A method of fabricating an optoelectronic integrated circuit according to claim 29, wherein:
each given thyristor device of said array is configured as a vertical cavity lasing device to thereby provide an array of vertical cavity lasing devices that emit light at different wavelengths.

36. A method of fabricating an optoelectronic integrated circuit according to claim 29, wherein:
each given thyristor device of said array is configured as an optical detecting device to thereby provide an array of optical detectors that detect input optical pulses at different wavelengths and produces corresponding output pulses.

37. A method of fabricating an optoelectronic integrated circuit according to claim 29, wherein:
said output pulses are electrical output pulses that correspond to detected input optical pulses at different wavelengths.

38. A method of fabricating an optoelectronic integrated circuit according to claim 29, wherein:
said output pulses are optical output pulses that correspond to detected input optical pulses at different wavelengths.

39. A method of fabricating an optoelectronic integrated circuit according to claim 29, wherein:
each given thyristor device of said array comprises a n-type modulation doped quantum well structure and a p-type modulation doped quantum well structure.

40. A method of fabricating an optoelectronic integrated circuit according to claim 39, further comprising:
coupling a current source to at least one of said n-type modulation doped quantum well structure and a p-type modulation doped quantum well structure.

41. A method of fabricating an optoelectronic integrated circuit according to claim 39, wherein:
each given thyristor device comprises a p-channel FET transistor formed on said substrate and an n-channel FET transistor formed atop said p-channel FET transistor, said p-channel FET transistor formed from said p-type modulation doped quantum well structure and said n-channel FET transistor formed from said n-type modulation doped quantum well structure.

42. A method of fabricating an optoelectronic integrated circuit according to claim 41, wherein:
said p-channel FET transistor includes a bottom contact layer,
said n-channel FET transistor includes said a top contact layer, and
said given thyristor device further comprises an anode terminal operably coupled to said top contact layer, a cathode terminal operably coupled to said bottom contact layer, and an injector terminal operably coupled to at least one of said n-type modulation doped quantum well structure and said p-type doped p-type quantum well structure.

43. A method of fabricating an optoelectronic integrated circuit according to claim 42, further comprising:
implanting n-type ions into said n-type modulation doped quantum well structure to form at least one n-type implant that couples said injector terminal to said n-type modulation doped quantum well structure.

44. A method of fabricating an optoelectronic integrated circuit according to claim 42, further comprising:
implanting p-type ions into said p-type modulation doped quantum well structure to form at least one p-type implant that couples said injector terminal to said p-type modulation doped quantum well structure.

45. A method of fabricating an optoelectronic integrated circuit according to claim 42, wherein:
said given thyristor device further comprises a metal layer for said anode terminal that is formed on said top contact layer, and a plurality of p-type layers formed between said top contact layer and said n-type modulation doped quantum well structure.

46. A method of fabricating an optoelectronic integrated circuit according to claim 45, further comprising:
implanting n-type ions into said multilayer structure to form n-type implants that are adjacent to an active area of said given thyristor device, and
depositing and patterning said metal layer for said anode terminal such that it is disposed over said n-type implants, such that said n-type implants provide for current funneling into said active area of said given thyristor device.

47. A method of fabricating an optoelectronic integrated circuit according to claim 45, wherein:
said plurality of p-type layers are separated from said n-type modulation doped quantum well structure by undoped spacer material.

48. A method of fabricating an optoelectronic integrated circuit according to claim 45, wherein:
said plurality of p-type layers include a top sheet and bottom sheet of planar doping of highly doped p-material separated by a lightly doped layer of p-material, whereby said top sheet achieves low gate contact resistance and said bottom sheet defines the capacitance of said n-channel FET transistor.

49. A method of fabricating an optoelectronic integrated circuit according to claim 42, further comprising:
coupling a current source to said injector terminal such that said current source draws bias current from a quantum well structure coupled thereto, and
coupling a load resistor to said cathode terminal such that a forward bias exists between said anode and cathode terminals that is less than maximum forward switching voltage of the thyristor device.

50. A method of fabricating an optoelectronic integrated circuit according to claim 49, wherein:
said given thyristor device is configured as an optical detector that detects an incident optical pulse of sufficient intensity at an associated wavelength and produces a corresponding output electrical pulse at the cathode terminal of said given thyristor device.

51. A method of fabricating an optoelectronic integrated circuit according to claim 50, wherein:
said given thyristor device is configured such that when said incident optical pulse has sufficient intensity at the associated wavelength, photocurrent is produced in said quantum well channel in excess of said bias current to produce a channel charge that exceeds a critical switching charge, thereby causing said thyristor device to switch to the ON state, and when the incident optical pulse is terminated, the bias current switches the thyristor device to the OFF state.

52. A method of fabricating an optoelectronic integrated circuit according to claim 51, wherein:
said given thyristor device is configured as a laser emitter that emits an output optical pulse at an associated wavelength in response to an input electrical pulse supplied to the injector terminal.

53. A method of fabricating an optoelectronic integrated circuit according to claim 52, wherein:
said given thyristor device is configured such that said input electrical pulse produces current in said quantum well channel in excess of said bias current to produce a channel charge that exceeds a critical switching charge, thereby causing said thyristor device to switch to the ON state, and when the input electrical pulse is terminated, the bias current switches the thyristor device to the OFF state, and wherein current through the given thyristor device in the ON state is greater than a characteristic lasing threshold current for the given thyristor device.

54. A method of fabricating an optoelectronic integrated circuit according to claim 29, wherein:
said resonant cavities comprise a bottom distributed bragg reflector mirror and a top dielectric mirror.

55. A method of fabricating an optoelectronic integrated circuit according to claim 54, wherein:
said thyristor devices are formed from an active device structured disposed between said bottom distributed bragg reflector mirror and said top dielectric mirror, and said substructure is disposed between said active device structure and said top dielectric mirror.

56. A method of fabricating an optoelectronic integrated circuit according to claim 54, wherein:
said resonant cavities include a plurality of diffraction gratings formed under said top dielectric mirror, wherein said diffraction gratings inject incident light that is propagating along an in-plane direction into the resonant cavities and/or emit light produced in the resonant cavities along an in-plane direction.

57. A method of fabricating an optoelectronic circuit according to claim 29, wherein:
N patterning and etching operations performed on said multilayer structure provide said resonant cavities with $2^N$ different vertical dimensions that correspond to $2^N$ different wavelengths.

* * * * *